(12) United States Patent
Zhang et al.

(10) Patent No.: US 12,126,407 B2
(45) Date of Patent: Oct. 22, 2024

(54) SIDEBAND SUPPRESSION METHOD AND APPARATUS, COMPUTER DEVICE, AND STORAGE MEDIUM

(71) Applicant: Tencent Technology (Shenzhen) Company Limited, Shenzhen (CN)

(72) Inventors: Zhenxing Zhang, Shenzhen (CN); Shengyu Zhang, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 336 days.

(21) Appl. No.: 17/460,006

(22) Filed: Aug. 27, 2021

(65) Prior Publication Data
US 2021/0391898 A1 Dec. 16, 2021

Related U.S. Application Data

(63) Continuation of application No. PCT/CN2020/124655, filed on Oct. 29, 2020.

(30) Foreign Application Priority Data

Feb. 3, 2020 (CN) .......................... 202010078701.2

(51) Int. Cl.
*H04B 7/0426* (2017.01)
*H04L 27/00* (2006.01)
*H04L 27/02* (2006.01)

(52) U.S. Cl.
CPC ......... *H04B 7/043* (2013.01); *H04L 27/0014* (2013.01); *H04L 27/02* (2013.01); *H04L 2027/003* (2013.01)

(58) Field of Classification Search
CPC ..... H03B 7/043; H04L 27/0014; H04L 27/02; H04L 2027/003; H04L 27/0018;
(Continued)

(56) References Cited

U.S. PATENT DOCUMENTS 4,105,895 A * 8/1978 Kennedy ................. F24H 1/202
219/439
5,162,763 A * 11/1992 Morris ..................... H03C 1/60
375/301

(Continued)

FOREIGN PATENT DOCUMENTS

CN          1773974 A     5/2006
CN      101435862 A     5/2009
(Continued)

OTHER PUBLICATIONS

Extended European Search Report, EP20918068.6, May 17, 2022, 9 pgs.
(Continued)

*Primary Examiner* — James M Perez
(74) *Attorney, Agent, or Firm* — Morgan, Lewis & Bockius LLP

(57) ABSTRACT

This application relates to a sideband suppression method performed at a computer device. The method includes: obtaining a target baseband signal, a target signal correlated parameter corresponding to the target baseband signal, the target signal correlated parameter including at least one of a signal feature parameter corresponding to the target baseband signal or a signal feature parameter of a carrier signal corresponding to the target baseband signal, and a corresponding target sideband suppression parameter according
(Continued)

to the target signal correlated parameter; performing signal correction on the target baseband signal based on the target sideband suppression parameter, to obtain a target corrected baseband signal, the target sideband suppression parameter being used for suppressing a power of a first suppression sideband corresponding to the target baseband signal; and inputting the target corrected baseband signal to a modulator for signal modulation, to obtain a target modulation signal corresponding to the target baseband signal.

19 Claims, 7 Drawing Sheets

(58) Field of Classification Search
CPC ............... H04L 27/0026; H04L 27/003; H04L 27/0044; H04L 27/0053; H04L 27/0057; H04L 27/20; H04L 27/2032; H04L 27/2053; H04L 27/206; H04L 27/2067; H04L 27/2089; H04L 27/32; H04L 27/34; H04L 27/36; H04L 27/362; H04L 27/364; H04L 2027/0024; H04L 2027/0026; H04B 7/02; H04B 7/04; H04B 7/0413; H04B 7/0426; H04B 7/043
See application file for complete search history.

(56) References Cited

U.S. PATENT DOCUMENTS

| | | | | |
|---|---|---|---|---|
| 5,396,196 A * | 3/1995 | Blodgett | ................... | H03C 1/52 332/123 |
| 6,222,878 B1 * | 4/2001 | McCallister | ........ | H04L 27/0014 375/284 |
| 7,130,589 B2 * | 10/2006 | Lee | ................... | H04B 17/0085 455/67.14 |
| 7,672,364 B2 * | 3/2010 | Kang | ....................... | H04L 27/38 455/73 |
| 7,733,949 B2 * | 6/2010 | Jin | ........................ | H04B 17/354 379/3 |
| 7,782,928 B2 * | 8/2010 | Kang | ....................... | H04B 17/14 455/73 |
| 7,826,549 B1 * | 11/2010 | Aggarwal | ............. | H04L 27/362 375/301 |
| 8,503,926 B2 * | 8/2013 | Gainey | ............... | H04L 27/3863 370/316 |
| 8,520,784 B1 * | 8/2013 | Lackey | ................ | H04B 7/0894 375/325 |
| 8,532,224 B2 * | 9/2013 | Van De Beek | ..... | H04L 27/0014 375/322 |
| 8,665,938 B2 * | 3/2014 | Yu | ........................ | H04B 17/14 375/228 |
| 8,831,136 B2 * | 9/2014 | Ishikawa | ............... | H03F 1/3241 375/295 |
| 8,976,895 B2 * | 3/2015 | Sombrin | ............... | H04B 1/0475 455/115.2 |
| 9,078,062 B2 * | 7/2015 | Lamb | ........................ | H04R 3/04 |
| 9,179,405 B2 * | 11/2015 | Ouchi | ................... | H04W 52/0209 |
| 9,203,448 B2 * | 12/2015 | Morita et al. | ............. | H03F 1/34 |
| 9,203,682 B2 * | 12/2015 | Winzer | ............... | H04L 27/0014 |
| 9,294,329 B2 * | 3/2016 | Kohda | ................... | H04L 27/368 |
| 9,325,553 B2 * | 4/2016 | Kaukovuori | ......... | H04J 11/0063 |
| 9,596,120 B2 * | 3/2017 | Yamanouchi | ......... | H04L 27/362 |
| 9,614,557 B1 * | 4/2017 | Mayer | ....................... | H04B 1/40 |
| 9,614,710 B2 * | 4/2017 | Yehudai | ............... | H04L 1/0041 |
| 9,780,891 B2 * | 10/2017 | Eo | ..................... | H04B 17/0085 |
| 9,893,924 B2 * | 2/2018 | Smail | ................... | H04L 27/3881 |
| RE46,931 E * | 7/2018 | McLaughlin | ........ | G01S 15/8963 |
| 10,079,625 B2 * | 9/2018 | Kimura | ............... | H04B 7/0413 |
| 10,211,928 B2 * | 2/2019 | Karar | ................... | H04B 10/532 |
| 10,222,461 B2 * | 3/2019 | McLaughlin | ........ | G01S 15/8963 |
| 10,225,123 B2 * | 3/2019 | Murakami | ............. | H04L 27/20 |
| 10,601,624 B2 * | 3/2020 | Limberg | ............... | H04L 25/067 |
| 11,057,123 B1 * | 7/2021 | Chang | ..................... | H04B 1/38 |
| 11,075,779 B2 * | 7/2021 | Yu | ...................... | H03K 19/0185 |
| 11,483,191 B2 * | 10/2022 | Hellfajer | ............ | H04L 27/2663 |
| 2003/0095607 A1 * | 5/2003 | Huang | ................... | H04L 27/368 375/296 |
| 2003/0171110 A1 * | 9/2003 | Shi | ........................ | H04B 1/406 455/324 |
| 2003/0206603 A1 * | 11/2003 | Husted | ................ | H04L 27/3863 375/324 |
| 2004/0082305 A1 * | 4/2004 | Kirschenmann | ....... | H04L 27/364 455/253.2 |
| 2006/0034356 A1 * | 2/2006 | Fechtel | ................... | H03D 3/008 375/219 |
| 2006/0097814 A1 * | 5/2006 | Schlesinger | .......... | H04L 27/364 332/103 |
| 2008/0037684 A1 * | 2/2008 | Lin | ........................ | H03D 3/009 375/299 |
| 2009/0175398 A1 * | 7/2009 | Inanoglu | .............. | H04L 27/3863 375/376 |
| 2011/0032046 A1 * | 2/2011 | Azarian | .............. | H04L 27/0014 324/118 |
| 2011/0090992 A1 * | 4/2011 | Chung | ................... | H04L 27/364 375/340 |
| 2012/0170629 A1 * | 7/2012 | Park | ...................... | H04L 27/2659 375/224 |
| 2012/0220246 A1 * | 8/2012 | Kushnir | ................. | H03D 3/004 455/118 |
| 2012/0263215 A1 * | 10/2012 | Peng | ..................... | H04B 1/0475 375/221 |
| 2013/0121500 A1 * | 5/2013 | Lamb | ....................... | H04R 3/04 381/71.1 |
| 2014/0093013 A1 * | 4/2014 | Ouchi | ................... | H04W 52/42 375/295 |
| 2014/0098913 A1 * | 4/2014 | Fernandes Barros | ....................... | H04L 27/3863 375/346 |
| 2014/0133599 A1 * | 5/2014 | Ouchi | ....................... | H04B 7/10 375/295 |
| 2014/0219666 A1 * | 8/2014 | Tselniker | ............ | H04L 27/2331 398/208 |
| 2016/0006491 A1 * | 1/2016 | Ouchi | ............... | H04W 52/0209 375/267 |
| 2016/0226698 A1 * | 8/2016 | Yamanouchi | ............. | H03F 3/19 |
| 2016/0308704 A1 * | 10/2016 | Yehudai | ................. | H04L 27/06 |
| 2016/0315798 A1 * | 10/2016 | Yun | ..................... | H04L 27/3863 |
| 2016/0337012 A1 * | 11/2016 | Kimura | ................... | H04B 1/16 |
| 2017/0111101 A1 * | 4/2017 | Ouchi | ................... | H01Q 21/24 |
| 2018/0091277 A1 * | 3/2018 | Davydov | ............... | H04L 5/0057 |
| 2018/0159612 A1 * | 6/2018 | Ouchi | ................... | H04L 5/0048 |
| 2018/0269983 A1 * | 9/2018 | Karar | ....................... | H04J 14/06 |
| 2019/0007105 A1 * | 1/2019 | Kimura | ................ | H04W 16/26 |
| 2019/0215051 A1 * | 7/2019 | Ouchi | ................... | H04L 5/0048 |
| 2019/0356363 A1 * | 11/2019 | Kimura | ................ | H04W 16/26 |
| 2020/0028725 A1 * | 1/2020 | Limberg | ............... | H04L 25/067 |
| 2020/0033696 A1 * | 1/2020 | Barber | ................... | G02F 1/353 |
| 2020/0084068 A1 * | 3/2020 | Beidas | ................. | H04B 1/0475 |
| 2020/0153487 A1 * | 5/2020 | Kimura | ................ | H04W 76/40 |
| 2021/0099329 A1 * | 4/2021 | Hellfajer | ............ | H04L 27/2657 |
| 2021/0273687 A1 * | 9/2021 | Kimura | ............... | H04B 7/0874 |
| 2021/0297303 A1 * | 9/2021 | Jiang | ..................... | H04L 27/364 |
| 2021/0391898 A1 * | 12/2021 | Zhang | ..................... | H04L 27/02 |
| 2022/0393725 A1 * | 12/2022 | Kimura | ............... | H04B 7/0697 |
| 2023/0074893 A1 * | 3/2023 | Zhang | ................. | H04W 52/146 |
| 2023/0179284 A1 * | 6/2023 | Ouchi | ................... | H04L 5/0048 375/267 |
| 2023/0344470 A1 * | 10/2023 | Kimura | ................ | H04W 4/06 |

FOREIGN PATENT DOCUMENTS

| | | |
|---|---|---|
| CN | 101521962 A | 9/2009 |
| CN | 101540626 A | 9/2009 |
| CN | 101557373 A | 10/2009 |
| CN | 103004234 A | 3/2013 |
| CN | 103067075 A | 4/2013 |
| CN | 105940649 A | 9/2016 |
| CN | 110535527 A | 12/2019 |
| EP | 1560391 A2 | 8/2005 |

(56) References Cited

FOREIGN PATENT DOCUMENTS

| EP | 2194665 A1 | 9/2008 |
|---|---|---|
| GB | 2558296 B | 2/2020 |
| JP | 2005295376 A | 10/2005 |
| WO | WO 2009041671 A1 | 4/2009 |

OTHER PUBLICATIONS

Tencent Technology, ISR, PCT/CN2020/124655, Jan. 27, 2021, 2 pgs.
Benjamin J. Chapman, et al., "Single-sideband Modulator for Frequency Domain Multiplexing of Superconducting Qubit Readout", Applied Physics Letters, Mar. 5, 2017, 6 pgs.
Tencent Technology, WO, PCT/CN2020/124655, Jan. 27, 2021, 4 pgs.
Tencent Technology, IPRP, PCT/CN2020/124655, Jul. 28, 2022, 5 pgs.

\* cited by examiner

SIDEBAND SUPPRESSION METHOD AND APPARATUS, COMPUTER DEVICE, AND STORAGE MEDIUM

CROSS-RELATED TO RELATED APPLICATIONS

This application is a continuation application of PCT Patent Application No. PCT/CN2020/124655, entitled "SIDEBAND SUPPRESSION METHOD AND APPARATUS, COMPUTER DEVICE, AND STORAGE MEDIUM" filed on Oct. 29, 2020, which claims priority to Chinese Patent Application No. 202010078701.2, filed with the State Intellectual Property Office of the People's Republic of China on Feb. 3, 2020, and entitled "SIDEBAND SUPPRESSION METHOD AND APPARATUS. COMPUTER DEVICE, AND STORAGE MEDIUM", all of which are incorporated herein by reference in their entirety.

FIELD OF THE TECHNOLOGY

This application relates to the field of signal processing technologies, and in particular, to a sideband suppression method and apparatus, a computer device, and a storage medium.

BACKGROUND OF THE DISCLOSURE

To better transmit a signal, a carrier is usually used to transmit the signal. The carrier is a physical basis and a carrying tool for signal transmission. For example, generally, a signal to be transmitted has a low frequency, and if the signal is transmitted based on the frequency thereof, it is not conducive to reception of the signal. Therefore, the signal to be transmitted may be loaded on a signal of a carrier, and the signal loaded with the carrier may be transmitted.

In another aspect, evolution of a quantum state of a superconducting qubit is usually implemented by using a microwave signal. To obtain higher fidelity of a quantum gate operation, a shape of the microwave signal is usually modulated to a certain extent. At present, the signal may be modulated by using a modulator, and a baseband signal and a carrier signal are used to generate a regulation signal of a final qubit.

However, due to non-ideality of a device itself, after the baseband signal is modulated, a useless sideband symmetrical to the carrier is usually formed. The useless sideband occupies communication transmission resources, and leads to waveform distortion and reduced fidelity of the signal.

SUMMARY

According to embodiments provided in this application, a sideband suppression method and apparatus, a computer device, and a storage medium are provided.

A sideband suppression method is provided, performed by a computer device, the method including: obtaining a target baseband signal and a target signal correlated parameter corresponding to the target baseband signal, the target signal correlated parameter including at least one of a signal feature parameter corresponding to the target baseband signal or a signal feature parameter of a carrier signal corresponding to the target baseband signal; obtaining a corresponding target sideband suppression parameter according to the target signal correlated parameter; performing signal correction on the target baseband signal based on the target sideband suppression parameter, to obtain a target corrected baseband signal, the target sideband suppression parameter being used for suppressing a power of a first suppression sideband corresponding to the target baseband signal; and inputting the target corrected baseband signal to a modulator for signal modulation, to obtain a target modulation signal corresponding to the target baseband signal.

A sideband suppression apparatus is provided, including: a target baseband signal obtaining module, configured to obtain a target baseband signal; a target signal correlated parameter obtaining module, configured to obtain a target signal correlated parameter corresponding to the target baseband signal, the target signal correlated parameter including at least one of a signal feature parameter corresponding to the target baseband signal or a signal feature parameter of a carrier signal corresponding to the target baseband signal; a target sideband suppression parameter obtaining module, configured to obtain a corresponding target sideband suppression parameter according to the target signal correlated parameter; a correction processing module, configured to perform signal correction on the target baseband signal based on the target sideband suppression parameter, to obtain a target corrected baseband signal, the target sideband suppression parameter being used for suppressing a power of a first suppression sideband corresponding to the target baseband signal; and a modulation module, configured to input the target corrected baseband signal to a modulator for signal modulation, to obtain a target modulation signal corresponding to the target baseband signal.

A computer device is provided, including a memory and a processor, the memory storing computer-readable instructions, the computer-readable instructions, when executed by the processor, causing the processor to perform the operations of the foregoing sideband suppression method.

A non-transitory computer-readable storage medium storing computer-readable instructions are provided, the computer-readable instructions, when executed by one or more processors, causing the one or more processors to perform the operations of the foregoing sideband suppression method.

Details of one or more embodiments of this application are provided in the subsequent accompanying drawings and descriptions. Other features, objectives, and advantages of this application are illustrated in the specification, the accompanying drawings, and the claims.

BRIEF DESCRIPTION OF THE DRAWINGS

To describe technical solutions in embodiments of this application more clearly, the following briefly introduces the accompanying drawings required for describing the embodiments. Apparently, the accompanying drawings in the following description show only some embodiments of this application, and a person of ordinary skill in the art may still derive other drawings from these accompanying drawings without creative efforts.

DESCRIPTION OF EMBODIMENTS

To make the objectives, technical solutions, and advantages of this application clearer and more understandable, this application is further described in detail below with reference to the accompanying drawings and the embodiments. It is to be understood that the specific embodiments described herein are merely used for explaining this application but are not intended to limit this application.

It may be understood that the terms "first", "second" and the like used in this application may be used for describing various elements in this specification. However, the elements are not limited by the terms unless otherwise specified. The terms are merely used for distinguishing a first element from another element. For example, without departing from the scope of this application, a first suppression sideband may be referred to as a second suppression sideband, and similarly, the second suppression sideband may be referred to as the first suppression sideband.

Figure 1:
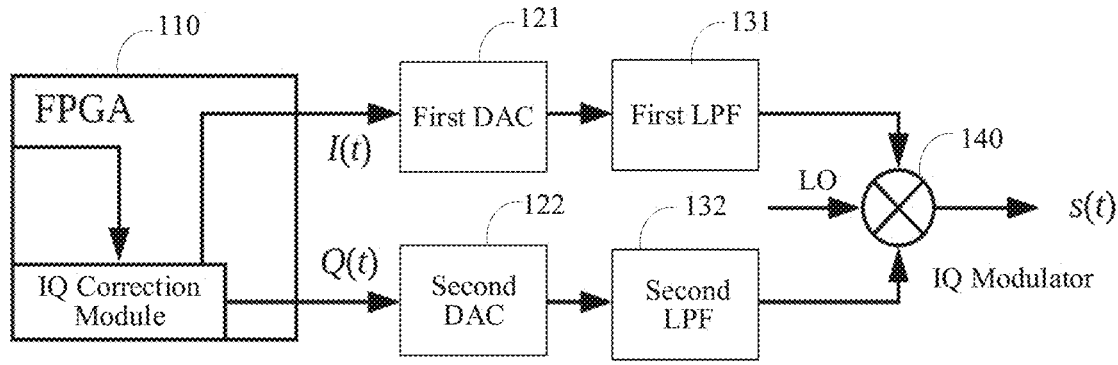
FIG. 1 is an application environment diagram of a sideband suppression method according to some embodiments.

FIG. 1 is an application environment diagram of a sideband suppression method according to some embodiments. As shown in FIG. 1, in this application environment, a quantum computer may correspond to a field programmable gate array (FPGA) 110, a first digital to analog converter (DAC) 121, a second DAC 122, a first low pass filter (LPF) 131, a second LPF 132, and an in-phase and quadrature phase (IQ) modulator 140. The IQ modulator is a four-port (including an I port, a Q port, an LO port, and an RF port) microwave device that may modulate microwave signals in quadrature. The I port and the Q port input baseband signals of medium and low frequencies respectively. The LO (local oscillator) port inputs carrier signals. The RF (radio frequency) port outputs modulated signals. The computer may input to the FPGA a target baseband signal that is expected to be outputted, and correct the target baseband signal through an IQ correction module in the FPGA. After a real part $I(t)$ and an imaginary part $Q(t)$ of the corrected signal pass through the DAC and the LPF, two target corrected baseband signals are obtained. The target corrected baseband signal corresponding to the real part is inputted to the I port of the IQ modulator, and the target corrected baseband signal corresponding to the imaginary part is inputted to the Q port of the IQ modulator. The LO port of the modulator is connected to a carrier for signal modulation, to obtain the modulated signal $s(t)$. $s(t)$ may be a signal used to regulate a superconducting qubit. t in $s(t)$, $I(t)$, and $Q(t)$ represents a time variable t, for example, $s(t)$ represents a modulation signal at the time t. The IQ correction module may be included in the FPGA to correct a baseband signal. The IQ correction module may be a module that implements an IQ compensation algorithm on hardware, and a signal correction algorithm provided in this embodiment of this application may also be referred to as the IQ compensation algorithm.

According to the method provided in this embodiment of this application, the target baseband signal may be corrected before the signal is modulated by using the IQ modulator. Signal correlated parameters may include, for example, a frequency of a carrier, and a frequency and an amplitude of a baseband signal. For example, for any general signal $z_0(t)$, due to the non-ideality of the actual IQ modulator, there are often errors caused by one or more of IQ baseband amplitude imbalance $\rho_1$, IQ baseband phase imbalance $\kappa$, quadrature carrier amplitude imbalance $\rho_2$, or quadrature carrier phase imbalance $\lambda$, resulting in useless sidebands. Generally, such errors are not easily directly measured. However, the inventor of this application found through actual measurement that the IQ baseband amplitude imbalance $\rho$ and the baseband phase imbalance $\kappa$ are not fixed, and usually change with signal correlated parameters corresponding to the baseband signal. For example, the IQ baseband amplitude imbalance $\rho$ and the baseband phase imbalance $\kappa$ are usually correlated to a frequency f of the baseband signal and a baseband signal amplitude A at the frequency of the baseband signal, and the carrier phase imbalance A is usually correlated to a carrier frequency $f_c$. Therefore, the inventor of this application found through calculation (the principle is described later) that a corresponding target sideband suppression parameter may be obtained according to the signal correlated parameters of the target baseband signal, such as the frequency f, the amplitude A, or the carrier frequency $f_c$ of the baseband signal. Based on the target sideband suppression parameter, the target baseband signal is pre-processed to obtain a target corrected baseband signal. After the signal correction based on the target sideband suppression parameter, a difference $\Delta S$ between the target corrected baseband signal and the target baseband signal may offset the errors caused by the non-ideality of the IQ modulator as much as possible, thereby suppressing a signal corresponding to a useless sideband in the modulation signal obtained by modulation as much as possible.

Figure 2:
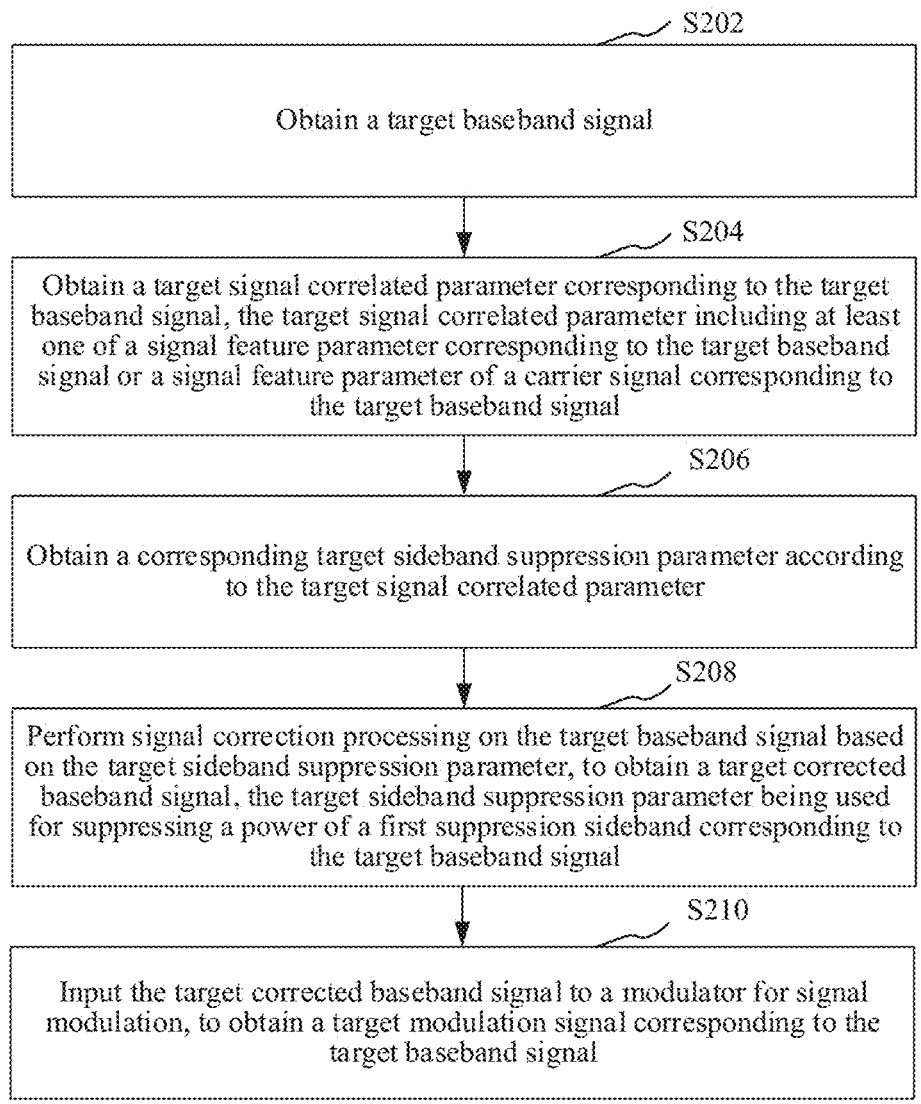
FIG. 2 is a flowchart of a sideband suppression method according to some embodiments.

As shown in FIG. 2, in some embodiments, a sideband suppression method is provided. This embodiment is described mainly by using an example in which the method is applied to the foregoing quantum computer. The method may further include the following steps:

Step S202. Obtain a target baseband signal.

Specifically, the target baseband signal is a baseband signal that needs to be modulated, and the baseband signal may be an unmodulated original electric signal sent by a signal source. The computer sends a digital signal corresponding to the baseband signal to DACs, and the DACs (121 and 122 in FIG. 1) generate continuous analog signals from the digital signal. The signals may be used as baseband signals.

Step S204. Obtain a target signal correlated parameter corresponding to the target baseband signal, the target signal correlated parameter including at least one of a signal feature parameter corresponding to the target baseband signal or a signal feature parameter of a carrier signal corresponding to the target baseband signal.

Specifically, the signal correlated parameter is a parameter correlated to the target baseband signal. A signal feature parameter is a parameter correlated to a feature of a baseband signal, and the signal feature parameter may include at least one of a frequency of the signal, an amplitude of the signal, or a time length of the signal. For example, a frequency and a signal amplitude corresponding to the target baseband signal, and a frequency corresponding to a carrier may be obtained as target signal correlated parameters.

The carrier signal is a waveform used for modulation to transmit a signal, and may be a sinusoidal signal. The modulation refers to a process of loading a baseband signal to be transmitted on the carrier signal, that is, a process of shifting the baseband signal to the carrier to perform spectrum shift. The purpose of modulation may be to transform the signal to be transmitted into a signal suitable for channel transmission, such as a high-frequency signal. The purpose of modulation may be alternatively to generate a high-frequency control signal by using a medium-low frequency baseband signal. However, the high-frequency signal is not used for transmission purposes, but is used, for example, as a signal for controlling a superconducting qubit. Generally, a baseband signal is a low-frequency signal, and a carrier is a high-frequency signal.

In some embodiments, the target baseband signal obtained by the computer may be a target baseband signal in a time domain. Therefore, frequency domain transformation may be performed on the target baseband signal in the time domain to obtain a target baseband signal in a frequency domain, and obtain a frequency and an amplitude of the target baseband signal in the frequency domain.

Step S206. Obtain a corresponding target sideband suppression parameter according to the target signal correlated parameter.

Specifically, the sideband suppression parameter is a parameter used for sideband suppression. The sideband suppression parameter may be obtained by parameter adjustment in a direction of decreasing a power of a signal corresponding to a sideband that needs to be suppressed, for example, the power of the sideband that needs to be suppressed corresponding to the sideband suppression parameter is less than a preset power threshold. Therefore, by processing the signal using a sideband suppression parameter may decrease the power of the signal corresponding to the sideband that needs to be suppressed. A set of correspondences between signal correlated parameters and sideband suppression parameters may be preset, such as a correspondence table of signal correlated parameters and sideband suppression parameters. Therefore, after obtaining the target signal correlated parameter, the computer may obtain a sideband suppression parameter corresponding to the target signal correlated parameter according to the pre-stored correspondence table of the signal correlated parameters and the sideband suppression parameters.

The target sideband suppression parameter corresponding to the target signal correlated parameter may be a direct correspondence or an indirect correspondence. The direct correspondence means that there is a sideband suppression parameter corresponding to the target signal correlated parameter in the set of correspondences. For example, it is assumed that the target signal correlated parameter is a, there are the target signal correlated parameter a and a sideband suppression parameter corresponding to the target signal correlated parameter a in the set of correspondences. The indirect correspondence means that there is no sideband suppression parameter directly corresponding to the target signal correlated parameter in the set of correspondences. Because signal correlated parameters corresponding to the baseband signal in different scenarios are different, there is to be a heavy workload if sideband suppression parameters corresponding to the signal correlated parameters need to be pre-determined. Therefore, the target sideband suppression parameter corresponding to the target signal correlated parameter may be obtained by interpolation according to the correspondence in the set of correspondences. In another example, the target signal correlated parameter needs to be transformed to obtain a transformed signal correlated parameter after transformation. A sideband suppression parameter corresponding to the transformed signal correlated parameter is further obtained. The target sideband suppression parameter corresponding to the target signal correlated parameter is obtained according to the sideband suppression parameter corresponding to the transformed signal correlated parameter. For example, it is assumed that the target sideband suppression parameter includes a frequency f of the target baseband signal, the frequency of the target compensation signal needs to be transformed to −f. The target sideband suppression parameter with the transformed frequency, that is, the frequency −f needs to be obtained first, and then an initial compensation signal is processed. After the target compensation signal is obtained, the baseband signal is compensated.

In some embodiments, the target sideband suppression parameter may be a real number or a complex number. Because a signal may generally be represented by a complex number, the target sideband suppression parameter may be a complex number.

Step S208. Perform signal correction on the target baseband signal based on the target sideband suppression parameter, to obtain a target corrected baseband signal, the target sideband suppression parameter being used for suppressing a power of a first suppression sideband corresponding to the target baseband signal.

Specifically, if the modulated signal is not processed, a frequency band is generated on each of upper and lower sides of a center carrier frequency, and the frequency bands on the upper and lower sides are referred to as sidebands. The first suppression sideband is a sideband that needs to be suppressed in a modulation signal corresponding to the target baseband signal, that is, a useless sideband. For example, when a baseband signal with a frequency of f is modulated by using a carrier with a frequency of $f_c$, a modulation signal outputted includes a frequency component of $f_c-f$ and a frequency component of $f_c+f$. That is, there are sidebands that are symmetrical to the carrier due to the non-ideality of the device. In an ideal situation, only a sideband at the frequency of $f_c-f$ is expected, and therefore the sideband at the frequency of $f_c+f$ is a useless sideband caused by the non-ideality of the actual device. For example, in an application of a superconducting qubits, the modulated signal usually needs to be at a frequency close to a frequency corresponding to an energy level difference between two energy levels |0>, |1> of the superconducting qubit, and a typical value corresponding to the frequency is around 6 GHz. Therefore, it is generally hoped that the frequency of the carrier is generally located in a range of several hundred MHz centered on the frequency of the qubit. Therefore, the useless sideband $f_c+f$ not only occupies transmission resources, but also causes signal distortion, which causes additional excitation to the superconducting qubits and affects the accuracy of a quantum gate operation.

The signal obtained by performing signal correction on the target baseband signal is the target corrected baseband signal. The correction processing may include at least one of adding a compensation signal to the target baseband signal or multiplying the target baseband signal by the target sideband suppression parameter. The compensation signal may be obtained by processing the target sideband suppression parameter.

In some embodiments, an initial compensation signal corresponding to the target baseband signal may be obtained; a target compensation signal may be obtained according to the target sideband suppression parameter and the initial compensation signal; and the target baseband signal may be corrected based on the target compensation signal to obtain a target corrected baseband signal.

Specifically, the initial compensation signal may be determined according to the target baseband signal. For example, the initial compensation signal may be a complex conjugated signal corresponding to the target baseband signal. A complex conjugated signal of a signal is a signal with the same real part and an opposite imaginary part. After the target sideband suppression parameter is obtained, the target sideband suppression parameter may be used to process the initial compensation signal to obtain the target compensation signal. The target baseband signal is then corrected based on the target compensation signal to obtain the target corrected baseband signal.

In some embodiments, the obtaining the target compensation signal according to the target sideband suppression parameter and the initial compensation signal includes: multiplying the target sideband suppression parameter by the initial compensation signal to obtain a target compensation signal, the initial compensation signal being a complex conjugated signal corresponding to the target baseband signal, and a frequency of the initial compensation signal being opposite to a frequency of the target baseband signal; and the correcting the target baseband signal based on the target compensation signal to obtain the target corrected baseband signal includes: adding the target compensation signal and the target baseband signal to obtain the target corrected baseband signal.

Specifically, because the frequency of the initial compensation signal is opposite to the frequency of the target baseband signal, the initial compensation signal is a complex conjugated signal corresponding to the target baseband signal. Therefore, the computer may perform a reverse processing on the target baseband signal, so that the target corrected baseband signal obtained by the correction offsets the useless sideband caused by the non-ideality of the modulator, that is, the useless sideband is suppressed. A general principle of sideband suppression is as follows: The inventor of this application found that when a modulator is used to modulate the signal, an error caused by the modulation is not fixed, but is correlated to the target signal correlated parameter corresponding to the baseband signal. Therefore, it is necessary to flexibly determine a signal compensation coefficient (that is, the sideband suppression parameter) according to the signal correlated parameter of the target baseband signal, and to flexibly determine the initial compensation signal according to the target baseband signal, to flexibly obtain the target compensation signal according to the target baseband signal, and add the target compensation signal and the target baseband signal to obtain the target corrected baseband signal. In this way, the purpose of suppressing the useless sideband can be achieved, and the baseband signal can be corrected in time according to the signal correlated parameter of the current baseband signal in a situation in which the baseband signal is constantly changing.

In some embodiments, it may be understood that when the target compensation signal and the target baseband signal are added to obtain the target corrected baseband signal, if the target baseband signal is a time-domain signal and the target compensation signal is a frequency-domain signal, the time-domain target baseband signal may be converted into a frequency-domain target baseband signal, and then the addition is performed.

In some embodiments, when the target baseband signal obtained by the computer is a time-domain baseband signal, that is, an analog signal, the correcting the target baseband signal based on the target compensation signal to obtain the target corrected baseband signal includes: performing frequency domain transformation on the target baseband signal in a time domain, to obtain a target baseband signal in a frequency domain; correcting the target baseband signal in the frequency domain based on the initial compensation signal, to obtain a corrected baseband signal in the frequency domain; and performing time domain transformation on the corrected baseband signal in the frequency domain, to obtain the target corrected baseband signal in the time domain.

Specifically, the frequency domain transformation refers to transforming a signal in the time domain into a signal in the frequency domain. The time domain transformation refers to transforming a signal in the frequency domain into a signal in the time domain. Fourier transform may be performed on the target baseband signal in the time domain to obtain the target baseband signal in the frequency domain, and obtain the frequency corresponding to the target baseband signal in the frequency domain. The initial compensation signal is a signal in the frequency domain. Therefore, the initial compensation signal in the frequency domain may be used to correct the target baseband signal in the frequency domain, to obtain the corrected baseband signal in the frequency domain. Inverse Fourier transform is then performed on the corrected baseband signal in the frequency domain to obtain the target corrected baseband signal in the time domain.

For example, for any target baseband signal $z_0(t)$, the computer may use Fourier transform $\mathcal{F}$ to obtain the target baseband signal in the frequency domain, which is represented by formula (1). The initial compensation signal may be the complex conjugated signal corresponding to the target baseband signal. Therefore, the target sideband suppression parameter is multiplied by the initial compensation signal, and the obtained target compensation signal may be represented by formula (2). The target compensation signal and the target baseband signal are added to obtain the corrected baseband signal in the frequency domain, which may be represented by formula (3). The time domain transformation is performed on the corrected baseband signal in the frequency domain, and the target corrected baseband signal in the time domain may be represented by formula (4). $\hat{z}_0(f)$ represents the target baseband signal in the frequency domain at the frequency f; that is, a spectrum function. i represents an imaginary number, exp represents that a base number is a natural constant e, $Z_B$ represents the target compensation signal, and −f represents an opposite frequency of the frequency f of the target baseband signal. $f_c$ represents the frequency of the carrier. c represents the sideband suppression parameter. $\hat{z}_0^*(-f)$ represents $\mathcal{F}[z_0(t)]^*(-f)$, where "*" represents the complex conjugate. $|\hat{z}_0(-f)|$ represents the amplitude of $\hat{z}_0(-f)$. $\hat{z}(f)$ represents the corrected baseband signal in the frequency domain, and z(t) represents the target corrected baseband signal in the time domain. It may be understood that the target signal correlated parameter may further include another parameter, for example, may include a signal length.

$$\mathcal{F}[z_0(t)] = \hat{z}_0(f) = \int_{-\infty}^{\infty} z_0(t)\exp[-2\pi i f t]dt \quad (1)$$

$$Z_B = c(f_c, -f, |\hat{Z}_0(-f)|)\hat{Z}_0*(-f) \quad (2)$$

$$\hat{z}(f) = \hat{Z}_0(f) + c(f_c, -f, |\hat{Z}_0(-f)|)\hat{Z}_0*(-f) \quad (3)$$

$$z(t) = \int_{-\infty}^{\infty} \hat{z}(f)\exp[2\pi i f t]df \quad (4)$$

Step S210. Input the target corrected baseband signal to a modulator for signal modulation, to obtain a target modulation signal corresponding to the target baseband signal.

Specifically, after obtaining the target corrected baseband signal, the computer may use a real part of the target corrected baseband signal as input of the I port of the modulator, use an imaginary part of the target corrected baseband signal as input of the Q port of the modulator, and use the carrier signal as input of the LO port of the modulator, to use the carrier for modulation to obtain the modulated signal as the target modulation signal, and the target modulation signal is outputted from the RF port of the modulator.

For example, it is assumed that the target corrected baseband signal is represented as z(t), the real part $\Re[z(t)]$ thereof may be used as the input of the I port, and the imaginary part $\Im[z(t)]$ may be used as the input of the Q port. That is, $I(t)=\Re[z(t)], Q(t)=\Im[z(t)]$. Because correction processing may be pre-performed on the baseband signal, for the modulated signal, the signal on the suppression sideband is suppressed. Therefore, the outputted modulated signal contains only an expected output frequency component or less useless frequency components. Therefore, for any baseband signal, signal correction processing may be performed based on a signal correlated parameter thereof to achieve an effect of suppressing a sideband of any signal.

In the foregoing sideband suppression method, when the target baseband signal needs to be transmitted, the target sideband suppression parameter may be obtained based on the target signal correlated parameter corresponding to the target baseband signal. After signal correction processing is performed on the target baseband signal based on the target sideband suppression parameter, the target baseband signal is inputted to the modulator for signal modulation, to obtain the target modulation signal corresponding to the target baseband signal. Before baseband signal modulation, correction processing is performed on the baseband signal based on the target sideband suppression parameter, to suppress the power of the suppression sideband corresponding to the target baseband signal. Therefore, when the corrected baseband signal is inputted to the modulator for signal modulation, the signal of the suppression sideband is suppressed, thereby improving the signal transmission efficiency and the signal fidelity.

Figure 3:
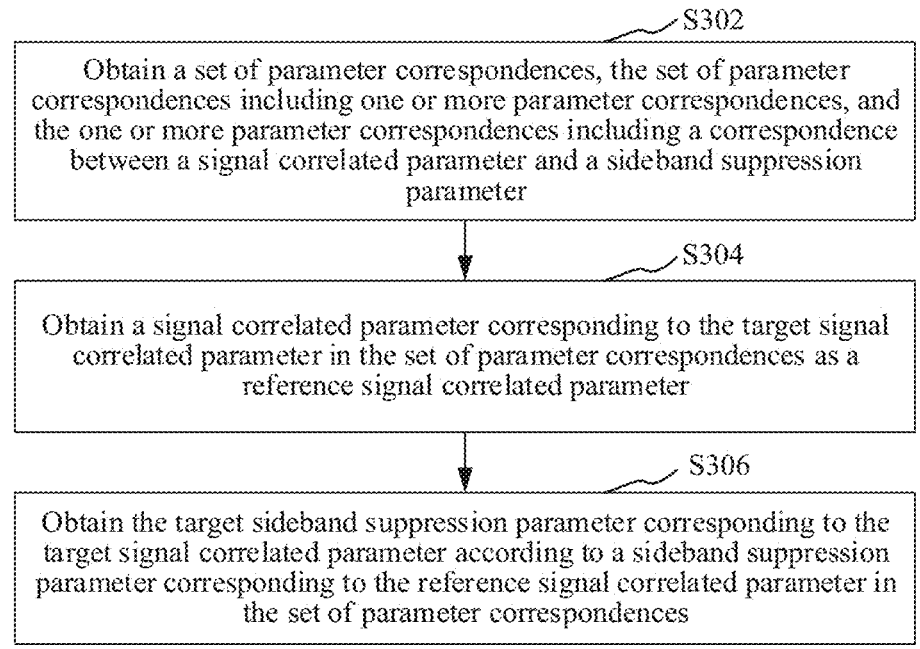
FIG. 3 is a flowchart of obtaining a corresponding target sideband suppression parameter according to a target signal correlated parameter according to some embodiments.

In some embodiments, as shown in FIG. 3, the obtaining a corresponding target sideband suppression parameter according to a target signal correlated parameter includes:

Step S302. Obtain a set of parameter correspondences, the set of parameter correspondences including one or more parameter correspondences, and the one or more parameter correspondences including a correspondence between a signal correlated parameter and a sideband suppression parameter.

Specifically, the set of parameter correspondences may include one or more parameter correspondences, and a specific quantity may be set according to requirements, for example, may include a sideband suppression parameter corresponding to a commonly used signal correlated parameter, which is specifically determined according to actual requirements. Because different baseband signals may correspond to different sideband suppression parameters, and baseband signals and carrier signals used in different scenarios may be different, the correspondence between a signal correlated parameter and a sideband suppression parameter may be pre-determined. For example, the sideband suppression parameters corresponding to the carrier frequency, the baseband frequency, and baseband amplitude may be pre-stored, and when signal correction is needed, the corresponding sideband suppression parameter may be obtained according to the parameter correspondence.

Step S304. Obtain a signal correlated parameter corresponding to the target signal correlated parameter in the set of parameter correspondences as a reference signal correlated parameter.

Specifically, the signal correlated parameter corresponding to the target signal correlated parameter may be a directly corresponding signal correlated parameter or an indirectly corresponding signal correlated parameter. In an example, the indirectly corresponding signal correlated parameter may be a transformed signal correlated parameter obtained by transforming the target signal correlated parameter, and a signal correlated parameter corresponding to the transformed signal correlated parameter is then obtained as the reference signal correlated parameter. For example, it is assumed that the target sideband suppression parameter includes the frequency f of the target baseband signal, f is transformed to the −f frequency, and a signal correlated parameter directly or indirectly corresponding to the −f frequency is then obtained as the reference signal correlated parameter.

In some embodiments, when the initial compensation signal is the complex conjugated signal corresponding to the target baseband signal, the frequency of the initial compensation signal is opposite to the frequency f of the target baseband signal, and is −f. The target sideband suppression parameter, that is, the compensation coefficient, is used to process the initial compensation signal. Because the target sideband suppression parameter is used to process the initial compensation signal, the sideband suppression parameter that is obtained is one corresponding to the signal correlated parameter corresponding to the initial compensation signal. Therefore, the signal correlated parameter of the corresponding initial compensation signal may be obtained according to the target signal correlated parameter, and the reference signal correlated parameter may be obtained according to the signal correlated parameter of the initial compensation signal. For example, the frequency opposite to the frequency of the target baseband signal may be obtained, and an amplitude corresponding to the initial compensation signal at the opposite frequency −f may be obtained. The frequency −f opposite to the frequency of the target baseband signal, the amplitude corresponding to the initial compensation signal, and the frequency of the carrier signal are used as reference signal correlated parameters.

In a practical example, it is assumed that the frequency of the target baseband signal is f, if the signal correlated parameter of the set of parameter correspondences includes the −f frequency, the −f frequency may be obtained as the reference signal correlated parameter. If the signal correlated parameter of the set of parameter correspondences does not include the −f frequency, a frequency close to the −f frequency may be obtained as the reference signal correlated parameter.

Step S306. Obtain the target sideband suppression parameter corresponding to the target signal correlated parameter according to a sideband suppression parameter corresponding to the reference signal correlated parameter in the set of parameter correspondences.

Specifically, the computer may use the sideband suppression parameter corresponding to the reference signal correlated parameter as the target sideband suppression parameter corresponding to the target signal correlated parameter. Alternatively, interpolation calculation may be performed according to the sideband suppression parameter corresponding to the reference signal correlated parameter in the set of parameter correspondences, to obtain the target sideband suppression parameter corresponding to the target signal correlated parameter.

In a practical example, it is assumed that the signal correlated parameter of the set of parameter correspondences includes the $-f$ frequency, the sideband suppression parameter corresponding to the $-f$ frequency may be obtained as the target sideband suppression parameter corresponding to the target signal correlated parameter. It is assumed that the signal correlated parameter of the set of parameter correspondences does not include the $-f$ frequency, a frequency close to $-f$ frequency may be obtained as a reference frequency, and a sideband suppression parameter of the reference frequency may be obtained for interpolation calculation, to obtain the target sideband suppression parameter corresponding to the target signal correlated parameter.

In this embodiment of this application, different signal correlated parameters, such as sideband compensation parameters corresponding to different carrier frequencies, different sideband frequencies, and different signal amplitudes, may be pre-calculated to obtain a multi-dimensional table of the sideband compensation parameter c. When in use, an actual coefficient may be obtained by looking up the table. After the actual coefficient is obtained, signal processing may be performed through formula (3), and time domain conversion may be performed through formula (4), to obtain a high-precision target corrected baseband signal.

Figure 4:
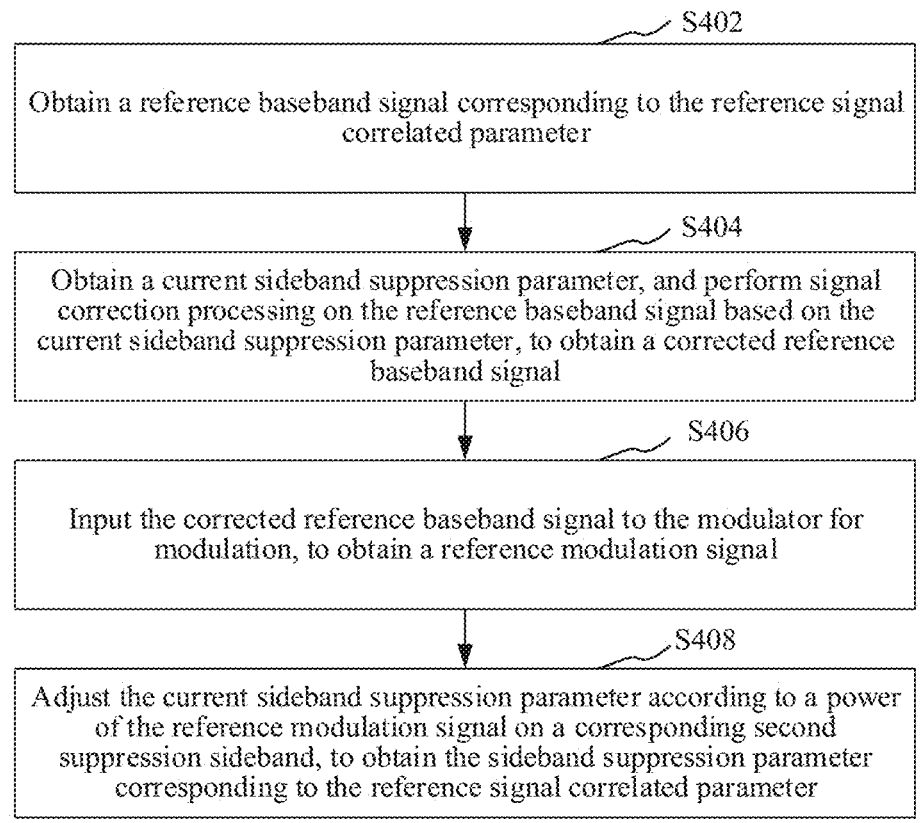
FIG. 4 is a flowchart of operations of obtaining a sideband suppression parameter corresponding to a reference signal correlated parameter in a set of parameter correspondences according to some embodiments.

In some embodiments, in the set of parameter correspondences, a sideband suppression parameter corresponding to each signal correlated parameter may be obtained through experiments. With reference to FIG. 4 below, the signal correlated parameter corresponding to the target signal correlated parameter in the set of parameter correspondences, that is, the reference signal correlated parameter, is used as an example, to describe the steps of obtaining the sideband suppression parameter corresponding to the reference signal correlated parameter. It may be understood that a sideband suppression parameter corresponding to each signal correlated parameter in the set of parameter correspondences may be obtained according to the same algorithm. As shown in FIG. 4, steps of obtaining a sideband suppression parameter corresponding to a reference signal correlated parameter in a set of parameter correspondences include:

Step S402. Obtain a reference baseband signal corresponding to the reference signal correlated parameter.

Specifically, the reference baseband signal corresponding to the reference signal correlated parameter refers to; the signal correlated parameter of the reference baseband signal may be the reference signal correlated parameter or the signal correlated parameter of the complex conjugated signal corresponding to the reference baseband signal. For example, it is assumed that a carrier frequency $f_c$, a baseband signal amplitude A, and a baseband frequency f are given, a reference baseband signal corresponding to the signal amplitude A and frequency f may be obtained, and a frequency of a carrier signal corresponding to the reference baseband signal is $f_c$.

Step S404. Obtain a current sideband suppression parameter, and perform signal correction on the reference baseband signal based on the current sideband suppression parameter, to obtain a corrected reference baseband signal.

Specifically, the current sideband suppression parameter is a sideband suppression parameter currently used for correction. In the process of determining the sideband suppression parameter, multiple experiments may be carried out to determine an optimal value of the sideband suppression parameter. Therefore, the current sideband suppression parameter may change as the experiment progresses. The initial current sideband suppression parameter may be any value, for example, may be 0. The steps of performing signal correction on the reference baseband signal based on the current sideband suppression parameter, to obtain a corrected reference baseband signal may refer to the steps of performing signal correction on the target baseband signal based on the target sideband suppression parameter, to obtain a target corrected baseband signal. For example, the obtaining a current sideband suppression parameter, and performing signal correction on the reference baseband signal based on the current sideband suppression parameter, to obtain a corrected reference baseband signal may be represented as formula (5), where $Z_C(t)$ represents the corrected reference baseband signal, A exp($2\pi ift$) is the reference baseband signal before the correction, and exp represents that a base number is a natural constant e. $c_d$ is the current sideband suppression parameter, and A exp($-2\pi ift$) is the initial compensation signal corresponding to the reference baseband signal.

$$Z_C(t)=I(t)+iQ(t)=A\exp(2\pi ift)+c_d \cdot A\exp(-2\pi ift) \quad (5)$$

Step S406. Input the corrected reference baseband signal to the modulator for modulation, to obtain a reference modulation signal.

Specifically, after the corrected reference baseband signal is obtained, the corrected reference baseband signal may be inputted to the modulator for modulation, and the modulated signal is used as the reference modulation signal.

Step S408. Adjust the current sideband suppression parameter according to a power of the reference modulation signal on a corresponding second suppression sideband, to obtain the sideband suppression parameter corresponding to the reference signal correlated parameter.

Specifically, the second suppression sideband is a sideband that needs to be suppressed in the reference modulation signal. For example, it is assumed that the reference baseband signal is f and the carrier frequency is $f_c$. The second sideband that needs to be suppressed may be $f_c+f$. The power of the reference modulation signal on the corresponding second suppression sideband may be calculated, and the current sideband suppression parameter is adjusted in a direction of decreasing the power of the reference modulation signal on the corresponding second suppression sideband, to obtain an updated current sideband suppression parameter. A gradient-free minimization algorithm, such as a Nelder-Mead (downhill simplex) algorithm or a Powell (Powell optimization, also referred to as directional acceleration) algorithm, may be used, to adjust the current sideband suppression parameter in the direction of decreasing the power of the reference modulation signal on the corresponding second suppression sideband, to obtain an updated current sideband suppression parameter.

In some embodiments, steps S404 to S408 may be executed for a plurality of times. When an update stop condition is not met, step S404 may be executed based on the updated current sideband suppression parameter, and the current sideband suppression parameter continues to be updated based on steps S404 to S408. Until the update stop condition is met, the finally updated current sideband suppression parameter is used as the sideband suppression parameter corresponding to the reference signal correlated parameter. The update stop condition includes at least one of a change between the current sideband suppression parameter before updating and the updated current sideband suppression parameter being less than a preset change threshold, the power on the second suppression sideband being less than a preset power threshold, or a quantity of updates of the current sideband suppression parameter being greater than a preset quantity. The preset change threshold, the preset quantity, and the preset power threshold may be set according to requirements. For example, the preset change threshold may be 0.01, and the preset quantity may be 100 times.

In some embodiments, the target signal correlated parameter includes a baseband frequency corresponding to the target baseband signal, a baseband amplitude corresponding to the target baseband signal, and a carrier frequency of the carrier signal corresponding to the target baseband signal, and the obtaining a corresponding target sideband suppression parameter according to a target signal correlated parameter includes: obtaining a carrier frequency; obtaining a set of parameter correspondences corresponding to the carrier frequency, the parameter correspondences including a correspondence between a baseband frequency corresponding to a baseband signal and a sideband suppression parameter, and a correspondence between a baseband amplitude corresponding to the baseband signal and the sideband suppression parameter; and obtaining the corresponding target sideband suppression parameter from the set of parameter correspondences according to the baseband frequency corresponding to the target baseband signal and the baseband amplitude corresponding to the target baseband signal.

Specifically, the baseband frequency corresponding to the baseband signal is the frequency of the baseband signal. In a quantum computer, a regulation signal used to regulate a superconducting qubit may be continuous, and the carrier frequency may be fixed. For each target baseband signal in the regulation signal, a carrier frequency of the regulation signal may be used for modulation. One of the target baseband signals may be a baseband signal of a preset time length in the regulation signal. Therefore, a set of parameter correspondences corresponding to the carrier frequency corresponding to the regulation signal that regulates the superconducting qubit may be obtained. In this way, a correspondence between a baseband frequency corresponding to a baseband signal and a sideband suppression parameter, and a correspondence between a baseband amplitude corresponding to the baseband signal and the sideband suppression parameter may be searched from the set of parameter correspondences, to improve the speed of obtaining the target sideband suppression parameter.

In some embodiments, the target corrected baseband signal obtained by correction may include a real part and an imaginary part. Therefore, the real part corresponding to the target corrected baseband signal may be inputted to an in-phase end (the I port) of the modulator, the imaginary part corresponding to the target corrected baseband signal is inputted to an orthogonal end (the Q port) of the modulator, and signal modulation is performed by using the carrier signal of the carrier frequency to obtain the target modulation signal corresponding to the target baseband signal. In this way, the target modulation signal may be used to regulate the superconducting qubit, to control the quantum computer.

Figure 5:
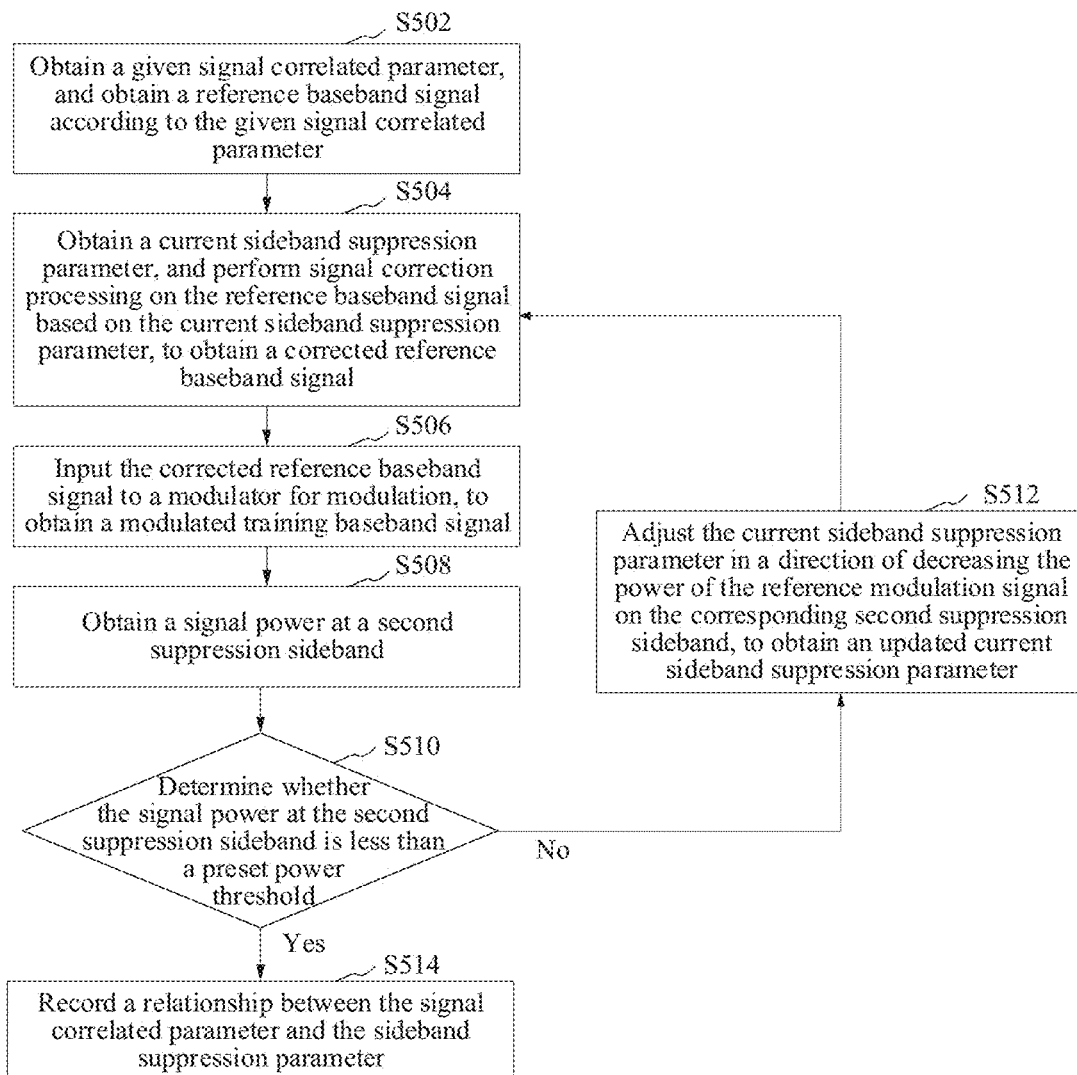
FIG. 5 is a flowchart of sideband calibration according to some embodiments.
Figure 6:
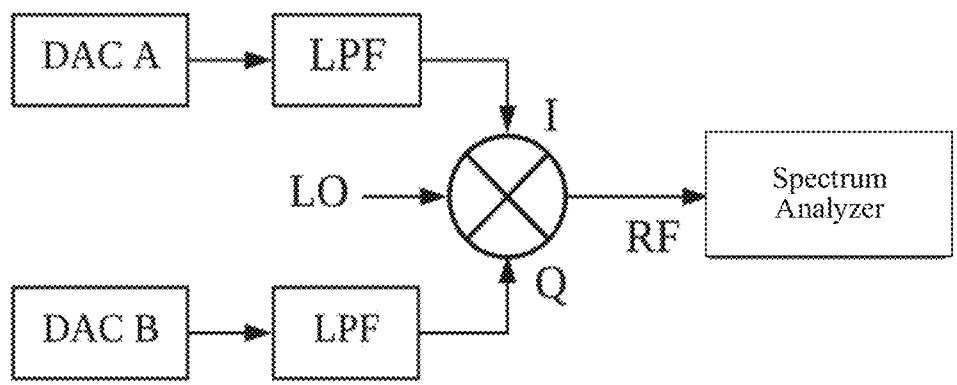
FIG. 6 is a diagram of a connection relationship between devices during sideband calibration according to some embodiments.
Figure 7:
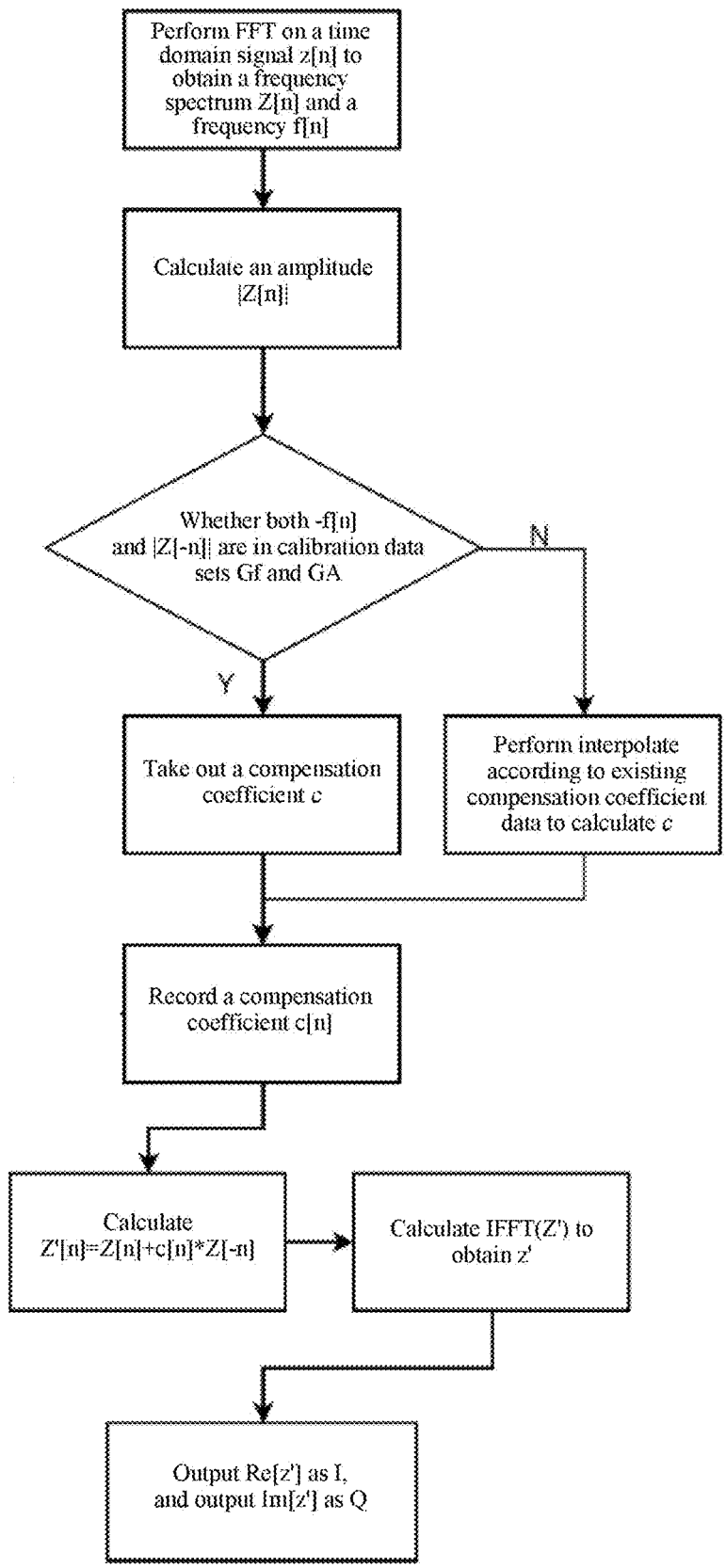
FIG. 7 is a schematic diagram of implementing signal sideband suppression according to some embodiments.

An example is used below in which the superconducting qubit is regulated. The solution of this embodiment of this application is described with reference to FIG. 5 to FIG. 7, where FIG. 5 is a flowchart of sideband calibration. FIG. 6 is a diagram of a connection relationship between devices during sideband calibration. FIG. 7 is a schematic diagram of a specific embodiment of implementing signal sideband suppression. The sideband calibration refers to a process of obtaining a sideband suppression parameter required to implement sideband suppression for the actual IQ modulator, and the sideband calibration may be pre-performed. The sideband suppression refers to suppression of an image sideband power. An image sideband refers to another sideband symmetrical to a carrier and generated due to the non-ideality of a device in single-sideband modulation.

As shown in FIG. 5, the sideband calibration includes the following steps:

Step S502. Obtain a given signal correlated parameter, and obtain a reference baseband signal according to the given signal correlated parameter.

Specifically, it is assumed that a carrier frequency $f_c$, a baseband signal amplitude A. and a baseband frequency $f$ are given, the reference baseband signal $A \exp(2\pi i f t)$ may be obtained.

Step S504. Obtain a current sideband suppression parameter, and perform signal correction on the reference baseband signal based on the current sideband suppression parameter, to obtain a corrected reference baseband signal.

Specifically, an initial current sideband suppression parameter, that is, a compensation coefficient c, may be 0. c may be updated subsequently. A calculation formula for the corrected reference baseband signal $Z_C(t)$ may be $Z_C(t) = I(t)+iQ(t) = A \exp(2\pi i f t) + c_d \cdot A \exp(-2\pi i f t)$.

Step S506. Input the corrected reference baseband signal to a modulator for modulation, to obtain a modulated training baseband signal.

Specifically, the corrected reference baseband signal $Z_C(t)$ is obtained and then inputted to the modulator, where a real part $\Re[Z_C(t)]$ is inputted to an I port, and an imaginary part $\Im[Z_C(t)]$ is inputted to a Q port.

Step S508. Obtain a signal power at a second suppression sideband.

Step S510. Determine whether the signal power at the second suppression sideband is less than a preset power threshold.

If yes, go to step 514; and if not, go to step 512.

Step S512. Adjust the current sideband suppression parameter in a direction of decreasing the power of the reference modulation signal on the corresponding second suppression sideband, to obtain an updated current sideband suppression parameter.

Step S514: Record a relationship between the signal correlated parameter and the sideband suppression parameter.

Specifically, $f_c+f$ is a useless sideband. A spectrum analyzer may be used to measure a signal outputted from an RF port and measure a signal power $P(c, f_c, f, A)$ at a frequency $f_c+f$. A gradient-free minimization algorithm, such as the Nelder-Mead algorithm or the Powell algorithm, is used to optimize c in the progress of the power $P(c, f_c, f, A)$. That is, the sideband suppression parameter c is changed in a direction of decreasing the power. Finally, the sideband suppression parameter c corresponding to the given signal correlated parameter is obtained. It may be understood that because frequencies and amplitudes of the baseband signal in different scenarios may be different, to flexibly select the corresponding sideband suppression parameter according to the signal correlated parameter of the baseband signal, the given signal correlated parameter may be changed. For example, the baseband signal amplitude A, the frequency f, and the carrier frequency $f_c$ are changed, the process of S502 to S512 is repeated, to obtain a value $c(f_c, f, A)$ of the compensation coefficient c under a different carrier frequency $f_c$, a different baseband frequency f, and a different baseband signal amplitude A, and a correspondence between a signal correlated parameter and a sideband suppression parameter is recorded, for example, $f_c$, f, A, c.

In this way, a multi-dimensional table of the sideband suppression parameter c may be obtained. When in use, an actual sideband suppression coefficient may be obtained by looking up the table.

As shown in FIG. 6, the real part of the corrected reference baseband signal passes through DAC A, and the imaginary part passes through DAC B, and then passes through a low-pass filter and is connected to the I port and the Q port of the IQ modulator. A sine wave of a frequency $f_c$ is connected to the LO port of the IQ modulator, and a power thereof meets normal working requirements of the IQ modulator. Meanwhile, the RF port is connected to the spectrum analyzer to measure an outputted RF signal to obtain a power at $f_c + f$.

After obtaining a sideband suppression parameter corresponding to each signal correlated parameter, a multi-dimensional table used for searching the sideband suppression parameter c may be obtained. The table includes the correspondence between a signal correlated parameter and a sideband suppression parameter. During signal transmission, an actual sideband suppression coefficient may be obtained by looking up the table. The following describes how to perform sideband suppression with reference to FIG. 7, including the following steps:

1. Obtain the Set of Parameter Correspondences Corresponding to the Carrier Frequency.

For example, as shown in FIG. 7, it is assumed that the current carrier frequency is $f_c$, the compensation coefficient c corresponding to $f_c$, the corresponding baseband frequency f, and the baseband amplitude A are taken and sent to the FPGA for temporary storage. The corresponding baseband frequency f is a set $G_f$, the corresponding baseband amplitude A is a set $G_A$, the compensation coefficient $c[f_m, A_n]$ is a two-dimensional array, $f_m$ represents a frequency of an $m^{th}$ calibrated baseband signal, and n represents a baseband amplitude of an $n^{th}$ calibrated baseband signal.

2. Perform Frequency Domain Transformation on the Target Baseband Signal in a Time Domain, to Obtain a Target Baseband Signal in a Frequency Domain.

For example, as shown in FIG. 7, after the FPGA receives time domain data $z[n]=I[n]+iQ[n]$ of the inputted baseband signal, Fast Fourier transform (FFT) is performed to obtain a spectrum $\hat{z}[n]$ of the baseband signal and the corresponding frequency f[n].

3. Obtain the Target Signal Correlated Parameter Corresponding to the Target Baseband Signal.

For example, as shown in FIG. 7, the amplitude $|\hat{z}[n]|$ may be calculated according to spectrum data $\hat{z}[n]$. At a frequency point $-f[n]$ and the amplitude $|\hat{z}[-n]|$, the sideband suppression parameter, that is, the compensation coefficient c, is obtained according to the set of parameter correspondences, where $\hat{z}[n]$ corresponds to the frequency f[n], and $\hat{z}[-n]$ corresponds to the frequency $-f[n]$. This is specifically divided into the following three cases. "Y" in FIG. 7 represents yes. "N" represents no. In FIG. 7, taking out the compensation coefficient c corresponds to case 1, and performing interpolation according to the existing compensation coefficient data corresponds to cases 2 and 3.

Case 1: when the frequency point $-f[n]$ and the amplitude $|\hat{z}[-n]|$ are both in the stored set of parameter correspondences (calibration data set), the compensation coefficient c corresponding to $-f[n]$ and $|\hat{z}[-n]|$ is directly taken from the stored set of parameter correspondences.

Case 2: when only one of the frequency point $-f[n]$ and amplitude $|\hat{z}[-n]|$ is in the stored set of parameter correspondences, a parameter that does not exist in the set of parameter correspondences is used as an independent variable, the compensation coefficient c is used as a dependent variable, and interpolation calculation is performed according to the set of parameter correspondences, to calculate the corresponding compensation coefficient c at the frequency point $-f[n]$ and amplitude $|\hat{z}[-n]|$.

Case 3: when both the frequency point $-f[n]$ and the amplitude $|\hat{z}[-n]|$ are not in the set of parameter correspondences, the two parameters are used as a first independent variable and a second independent variable, the compensation coefficient c is used as a dependent variable, and interpolation calculation is performed according to the set of parameter correspondences. The corresponding compensation coefficient c at the frequency point $-f[n]$ and amplitude $|\hat{z}[-n]|$ is calculated.

4. Perform Signal Correction on the Target Baseband Signal Based on the Target Sideband Suppression Parameter to Obtain the Target Corrected Baseband Signal.

Specifically, as shown in FIG. 7, the corrected baseband signal $\hat{z'}[n]$ in the frequency domain may be calculated according to the formula $\hat{z'}[n]=\hat{z}[n]+c[n]\times\hat{z}^*[-n]$, and inverse Fourier transform (IFFT) is performed on $\hat{z'}[n]$ to obtain the data z'[n] in the time domain.

5. Input the Target Corrected Baseband Signal to a Modulator for Signal Modulation, to Obtain a Target Modulation Signal Corresponding to the Target Baseband Signal.

As shown in FIG. 7, the real part $\Re$ [z'[n]] (that is, Re[z']) of the target corrected baseband signal may be sent to the DAC connected to the I channel of the IQ modulator, and the imaginary part $\Im$ [z'[n]] (that is, Im[z']) of the signal may be sent to the DAC connected to the Q channel of the IQ modulator, to obtain the target modulation signal through the modulator.

6. Control the superconducting qubit based on the target modulation signal.

The solutions provided in this embodiment of this application may adopt a solution in which correction is performed in the frequency domain, and the correction may be performed at a plurality of frequencies and a plurality of amplitudes. By correcting a signal, a high-quality control signal may be obtained. Therefore, the solution of this embodiment of this application may be applied to a superconducting quantum computer and measurement and control components of the superconducting quantum computer, including arbitrary waveform generators and digital-to-analog conversion modules. Any signal with a large bandwidth may be corrected. The waveform distortion is reduced, and measurement and control accuracy requirements of superconducting quantum computing are met. The principles and effects of the method provided in this embodiment of this application is described below.

The IQ modulator may modulate a low-frequency signal to a radio frequency band, and is widely used in the regulation and reading of superconducting qubits in the field of superconducting quantum computing. In an application of a superconducting qubit, a microwave signal usually needs to be near the energy level difference between the two energy levels |0>, |1> of the superconducting qubit, and the typical value corresponding to the frequency is around 6 GHz. The carrier frequency used is generally located in a range of several hundred MHz centered on the frequency of the qubit. A working principle of an ideal IQ modulator may be described by formula (6):

$$s(t)=\beta[I(t)\cos 2\pi f_c t+Q(t)\sin 2\pi f_c t] \quad (6)$$

where s(t) represents a modulation signal outputted from the RF port of the IQ modulator, I(t), Q(t) is a medium frequency signal inputted from the I and Q ports of the IQ modulator, the frequency of the carrier signal in the LO part is $f_c$, and $\beta$ describes conversion loss of the IQ modulator. When $I(t)+iQ(t)=A(t) e^{j2\pi ft}$, the signal $s(t)=\beta A(t) \cos 2\pi(f_c-f)t$ is outputted, thereby achieving effects of modulating the signal amplitude and changing the carrier frequency.

Figure 8:
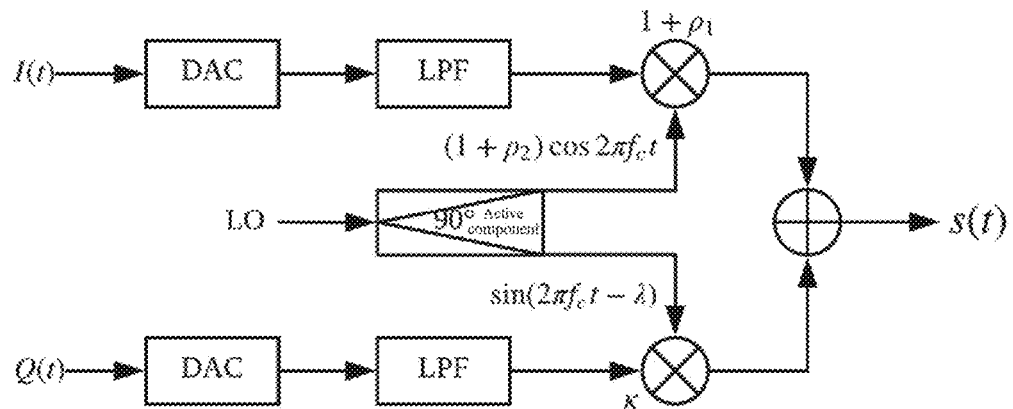
FIG. 8 is a diagram of a working principle of a quadrature modulator with errors according to some embodiments.

However, the actual IQ modulator is non-ideal, and there are mainly four kinds of errors: IQ baseband amplitude imbalance $\rho_1$, IQ baseband phase imbalance $\kappa$, quadrature carrier amplitude imbalance $\rho_2$, and quadrature carrier phase imbalance $\lambda$. After the errors are taken into account, a mathematical form of the modulation signal may be described by formula (7) to describe [6], and a working principle of a quadrature modulator containing errors is shown in FIG. 8. $1+\rho=(1+\rho_1)(1+\rho_2)$ in the formula represents final amplitude imbalance between the two channels of IQ.

$$s(t) = \beta\{(1+\rho)\cos 2\pi ft \cos 2\pi f_c t + \sin(2\pi ft - \kappa)\sin(2\pi f_c t - \lambda)\} = \quad (7)$$

$$\frac{\beta}{2}\{(1+\rho)\cos(2\pi ft - 2\pi f_c t) + (1+\rho)\cos(2\pi ft + 2\pi f_c t) +$$

$$\sin(2\pi ft - 2\pi f_c t - \kappa + \lambda) - \sin(2\pi ft + 2\pi f_c t - \kappa - \lambda)\}$$

It may be seen from formula (7) that in addition to an expected frequency component of $f_c-f$, the finally outputted radio frequency signal s(t) also contains a frequency component of $f_c+f$, which reduces the quality of the signal and affects the fidelity of the operation of the superconducting qubit gate. Therefore, a manner is needed to correct the signal. For example, in an application of superconducting quantum computing, a signal generated by using the IQ modulator is usually not a sine wave, but a Gaussian wave packet. A center frequency of the Gaussian wave packet is about 6 GHz, and a frequency spread is close to 100 MHz. In this case, because both a control signal and a read signal of the superconducting quantum computer are generated by using the IQ modulator, obtaining a high-quality control signal is crucial for improving the accuracy of the quantum gate operation. If correction is not performed, larger waveform distortion is caused and the fidelity of a quantum operation is affected.

Therefore, in the presence of errors, for any signal $z(t)=A(t)e^{i\varphi(t)}$, a real part $I_0(t)=\Re[A(t)e^{i\varphi(t)}]$ and an imaginary part $Q_0(t)=\Im[A(t)e^{i\varphi(t)}]$ thereof are IQ signals expected to be modulated under ideal conditions. z(t) may be expanded with Fourier series:

$$z(t) = \sum_{n=-\infty}^{+\infty} A_n e^{2\pi i f_n t + i\phi_n}$$

where $A_n$, $\phi_n$, $f_n$ is a real number that meets $$A_n e^{i\phi_n} = \frac{1}{T}\int_T z(t)e^{i2\pi f_n t}dt$$

and $$f_n = \frac{n}{T},$$

and T is a total duration of the signal z(t). Therefore, according to formula (7), the signal s(t) outputted from the RF port of the IQ modulator may be represented as:

$$s(t) = \sum_{n=-\infty}^{+\infty} \beta A_n(1+\rho)\cos(2\pi f_n t + \phi_n)\cos(2\pi f_c t) + \quad (8)$$

$$\beta A_n \sin(2\pi f_n t + \phi_n - \kappa)\sin(2\pi f_c t - \lambda)$$

It may be seen from formula (8) that when values of error sources $\rho$, $\kappa$, and $\lambda$ are correlated to the frequency $f_n$ or the amplitude $A_n$, the entire baseband signal waveform cannot be corrected simply by using the same calibration parameter. Therefore, for the sine wave signal $z_0(t)=I_0(t)+iQ_0(t)=A \exp[2\pi ift]$, to suppress an image sideband signal, that is, the signal of the frequency $f_c+f$, $z(t)=z_0(t)+c\cdot z_0^*(t)$ is given at an input end of IQ, where c is an undetermined complex number, which needs to be measured in the actual process. The outputted signal s(t) is:

$$s(t)=[(1+\rho)(\cos 2\pi ft+\Re[c]\cos 2\pi ft+\Im[c]\sin 2\pi ft)\cos 2\pi f_c t+[\sin(2\pi ft-\kappa)-\Re[c]\sin(2\pi ft+\kappa)]+\Im[c]\cos(2\pi ft-\kappa)]\sin(2\pi f_c t-\lambda) \quad (9)$$

The $f_c+f$ component of s(t) is calculated, and the real part and the imaginary part of the compensation coefficient c are adjusted, so that the component of $f_c+f$ may be 0. Therefore, formula (10) may be obtained according to the formula (9).

$$c = \frac{-\rho(2+\rho) + 2i\cos\kappa(\sin\kappa + (1+\rho)\sin\lambda)}{\cos 2\kappa + (1+\rho)(1+\rho+2\cos\kappa\cos\lambda)} \quad (10)$$

It may be seen from formula (10) that the compensation coefficient c includes three error sources of the IQ modulator. Therefore, it may be seen from the foregoing analysis that by changing the input signal $z_0(t)$ at the IQ port to z(t), a signal without a frequency component of the image sideband may be obtained.

Secondly, for any general signal $z_0(t)$, due to the actual IQ modulator itself, the IQ baseband amplitude imbalance $\rho$ and the baseband phase imbalance $\kappa$ thereof are usually correlated to the baseband frequency f and the baseband signal amplitude A at the current baseband frequency, and the carrier phase imbalance $\lambda$ is usually correlated to the carrier frequency $f_c$. Therefore, the compensation coefficient c is correlated to the three factors of the carrier frequency $f_c$, the baseband frequency f, and the baseband amplitude A, so that the compensation coefficient c may be represented as a function $c=c(f_c, f, A)$ of these variables. Similar to a sine wave signal, for any signal $z_0(t)$. Fourier transform $\mathcal{F}[z_0(t)]=\hat{z}_0(f)=\int_{-\infty}^{\infty} z_0(t) \exp[-2\pi ift]dt$ is first used to convert the signal $z_0(t)$ to a frequency space, to obtain a spectrum $\hat{z}_0(f)$ thereof, and the following corrections are performed thereon:

$$\hat{z}(f) = \hat{z}_0(f) + c(f_c - f, |\hat{z}_0(-f)|) \mathcal{F}^* \qquad (11)$$

where $\hat{z}_0(-f)$ represents $\mathcal{F}[z_0(t)]^*(-f)$. After the spectrum $\hat{z}_0(f)$ is obtained, $\hat{z}(f)$ is converted back to $z(t)$ in the time domain by using the inverse Fourier transform:

$$z(t) = \int_{-\infty}^{\infty} \hat{z}(f) \exp[2\pi i f t] dt$$

where the real part $\Re[z(t)]$ is outputted as the I channel, and the imaginary part $\Im[z(t)]$ is outputted as the Q channel, that is, $I(t) = \Re[z(t)], Q(t) = \Im[z(t)]$. According to the principle given above, it may be obtained that the sideband suppression process is implemented on the useless sideband of the baseband signal. Therefore, the finally outputted signal implements the suppression of unexpected sideband signals, so that the effect of suppressing a sideband of any signal is achieved.

The baseband signal is corrected in the frequency domain and then converted back to the time domain for output, so that calibration may be performed separately under different carrier frequencies, different sideband frequencies, and different signal amplitudes, to obtain a multi-dimensional table of the compensation coefficient c. When in use, an actual coefficient may be obtained by looking up the table. After obtaining an actual sum of coefficients, correction is performed by formula (11), to obtain a high-precision signal in the time domain.

According to the solution provided in this embodiment of this application, the waveform of the IQ modulator may be corrected under the condition of large bandwidth and varying baseband power, to achieve the effect of suppressing the image sideband, and improve the fidelity of the signal. In superconducting quantum computing, the fidelity of a superconducting qubit operation may be improved. A modulator IQ-0307 of Marki Company is used as a basis for a simulation test, to compare effects of the solution in this embodiment of this application with the solution without correction of the baseband signal and another correction solution in the following three cases. The other correction solution refers to a solution of directly measuring the amplitude imbalance and the phase imbalance of the IQ modulator, and obtaining the corresponding error parameters $\rho$ and $\kappa+\lambda$, to correct the signal. In IQ-0307, a typical value of IQ amplitude error is 0.3 dB, which corresponds to $\rho \in [-0.04, 0.04]$. A typical value of IQ phase error is 3°, and a corresponding radian is 0.05, that is, $\kappa, \lambda \in [-0.05, 0.05]$. In the following simulation, the carrier frequency is fixed at 5 GHz, an error model of an IQ mixer is the formula (3), and $\beta=1$ is selected. $\rho, \kappa, \lambda$ are randomly generated within a frequency range of $-0.5$ GHz to $0.5$ GHz, and a range thereof is specified as $\rho \in [-0.04, 0.04], \kappa, \lambda \in [-0.05, 0.05]$.

Test 1: the baseband signal is a sine wave, a length of the sine wave is 1024 ns, and the frequency is 125 MHz. Without correction, the sideband image suppression is about 25 dB, which is closer to the 23 dB given by the actual device. After correction of the solution provided in this application, the sideband image suppression reaches about 60 dB, which is an increase of about 35 dB.

Figure 9A:
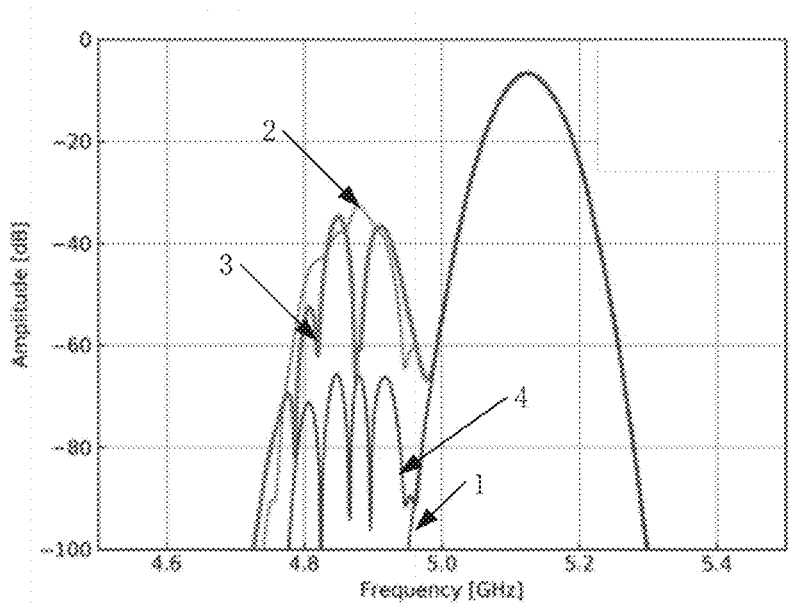
FIG. 9A is a diagram of a comparison effect between other solutions and solutions of embodiments of this application according to some embodiments.

Test 2: the error of the IQ modulator is not correlated to the baseband power, the baseband signal is selected as a Gaussian waveform, and a full width at half maximum of the Gaussian waveform is selected as a typical value of 10 ns in superconducting quantum computing. Meanwhile, to obtain better frequency resolution, a total time selected is 1024 ns, and the baseband frequency is selected as 125 MHz. FIG. 9A shows a comparison between other correction solutions and the special case (considering that the errors $\rho, \kappa, \lambda$ are only correlated to the frequency, and are not correlated to the power) of this correction solution when the baseband signal is a Gaussian waveform. Line 1 represents a signal spectrum after being mixed by an ideal IQ mixer; line 2 represents spectrum data of a signal after being mixed by a non-ideal IQ modulator without correction; line 3 represents a signal spectrum after being mixed by the non-ideal IQ mixer in other correction solutions; and line 4 represents a signal spectrum after being mixed by the non-ideal IQ mixer under the correction of this embodiment of this application. It may be seen from FIG. 9A that for a wide-bandwidth Gaussian signal, a correction effect of other correction solutions can only be corrected in a small frequency range near a fixed frequency, which is 125 MHz herein. The overall correction is not ideal, and sideband image suppression is not significantly improved. However, by using a correction result of the solution of this embodiment of this application, the sideband image suppression is improved by about 30 dB, reaching about 60 dB close to the case of a sine wave.

Figure 9B:
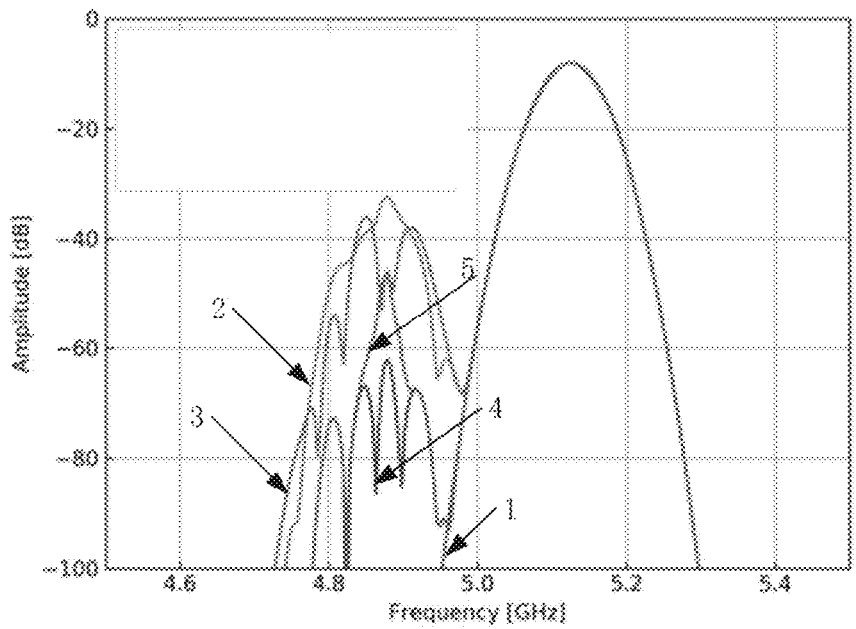
FIG. 9B is a diagram of a comparison effect between other solutions and solutions of embodiments of this application according to some embodiments.

Test 3: FIG. 9B shows a comparison between other correction solutions and the solution of this embodiment of this application when the errors of the IQ modulator (the baseband amplitude imbalance, the baseband phase imbalance, and the carrier phase imbalance) vary with the baseband power. Line 1 represents a signal spectrum after being mixed by an ideal IQ mixer; line 2 represents a signal spectrum after being mixed by a non-ideal IQ modulator without correction; line 3 represents a result under another correction solution; line 4 represents a spectrum of a signal after being mixed by the non-ideal IQ modulator when considering that the errors of the IQ modulator are correlated to both the baseband power and the baseband frequency in this implementation of this application; and line 5 represents a correction result when the errors of the IQ modulator are only correlated to the baseband frequency in this implementation of this application. The baseband waveform selected herein is still a Gaussian waveform, and a parameter of the Gaussian waveform is the same as that in test 2. It may be seen from FIG. 9B that when the errors of the IQ modulator change with the baseband power and the frequency, other correction solutions only have a certain suppression effect on the image signal in a small range near the center frequency. However, when only considering that the errors change with the baseband frequency (line 5), although the image signal may be suppressed in a wider range, the ability to suppress the signal near the center frequency is not strong enough. This is because the signal power is relatively strong near the center frequency, so that the errors ($\rho, \lambda, \kappa$) are quite different from the case in which the signal power is low. For the part far away from the center frequency, because the signal power itself is relatively low, the errors $\rho, \lambda,$ and $\kappa$ are not much different. In the solution (line 4) that both the baseband frequency and the baseband power are considered, as may be seen from FIG. 9B, an image suppression effect thereof is more obvious. Compared with the existing solution, it is improved by nearly 30 dB; and compared with the solution considering only the baseband frequency, the image suppression effect is improved by nearly 15 dB.

Therefore, it may be obtained according to the foregoing tests that, according to this implementation of this application, after the baseband signals of large bandwidth and different powers are corrected, the signal of the image sideband, that is, the useless sideband, can be suppressed, where frequency represents the frequency and amplitude represents the amplitude.

Figure 10:
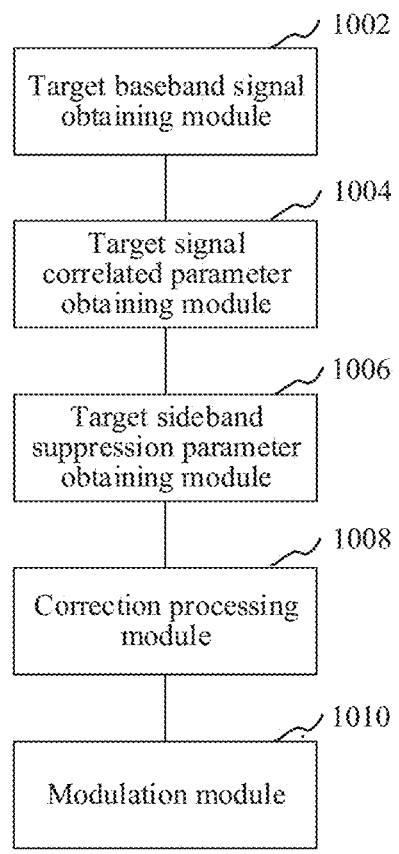
FIG. 10 is a structural block diagram of a sideband suppression apparatus according to an embodiment.

As shown in FIG. 10, in some embodiments, a sideband suppression apparatus is provided. The sideband suppression apparatus may be integrated in the foregoing FPGA, and may further include a target baseband signal obtaining module 1002, a target signal correlated parameter obtaining module 1004, a target sideband suppression parameter obtaining module 1006, a correction processing module 1008, and a modulation module 1010.

The target baseband signal obtaining module 1002 is configured to obtain a target baseband signal.

The target signal correlated parameter obtaining module 1004 is configured to obtain a target signal correlated parameter corresponding to the target baseband signal, the target signal correlated parameter including at least one of a signal feature parameter corresponding to the target baseband signal or a signal feature parameter of a carrier signal corresponding to the target baseband signal.

The target sideband suppression parameter obtaining module 1006 is configured to obtain a corresponding target sideband suppression parameter according to the target signal correlated parameter.

The correction processing module 1008 is configured to perform signal correction on the target baseband signal based on the target sideband suppression parameter, to obtain a target corrected baseband signal, the target sideband suppression parameter being used for suppressing a power of a first suppression sideband corresponding to the target baseband signal.

The modulation module 1010 is configured to input the target corrected baseband signal to a modulator for signal modulation, to obtain a target modulation signal corresponding to the target baseband signal.

In some embodiments, the correction processing module 1008 includes: an initial compensation signal obtaining unit, configured to obtain an initial compensation signal corresponding to the target baseband signal, a target compensation signal obtaining unit, configured to obtain a target compensation signal according to the target sideband suppression parameter and the initial compensation signal; and a correction unit, configured to correct the target baseband signal based on the target compensation signal to obtain a target corrected baseband signal.

In some embodiments, the target compensation signal obtaining unit is configured to multiply the target sideband suppression parameter by the initial compensation signal to obtain a target compensation signal, the initial compensation signal being a complex conjugated signal corresponding to the target baseband signal, and a frequency of the initial compensation signal being opposite to a frequency of the target baseband signal; and the correction unit is configured to add the target compensation signal and the target baseband signal to obtain the target corrected baseband signal.

In some embodiments, the correction unit is configured to perform frequency domain transformation on the target baseband signal in a time domain, to obtain a target baseband signal in a frequency domain; correct the target baseband signal in the frequency domain based on the initial compensation signal, to obtain a corrected baseband signal in the frequency domain; and perform time domain transformation on the corrected baseband signal in the frequency domain, to obtain the target corrected baseband signal in the time domain.

In some embodiments, the target sideband suppression parameter obtaining module 1006 includes: a parameter correspondence set obtaining unit, configured to obtain a set of parameter correspondences, the set of parameter correspondences including one or more parameter correspondences, and the one or more parameter correspondences including a correspondence between a signal correlated parameter and a sideband suppression parameter; a reference signal correlated parameter obtaining unit, configured to obtain a signal correlated parameter corresponding to the target signal correlated parameter in the set of parameter correspondences as a reference signal correlated parameter; and a target sideband suppression parameter obtaining unit, configured to obtain a target sideband suppression parameter corresponding to the target signal correlated parameter according to a sideband suppression parameter corresponding to the reference signal correlated parameter in the set of parameter correspondences.

In some embodiments, the target sideband suppression parameter obtaining unit is configured to perform interpolation calculation according to the sideband suppression parameter corresponding to the reference signal correlated parameter in the set of parameter correspondences, to obtain the target sideband suppression parameter corresponding to the target signal correlated parameter.

In some embodiments, the target sideband suppression parameter obtaining module is configured to: obtain a reference baseband signal corresponding to the reference signal correlated parameter; obtain a current sideband suppression parameter, and perform signal correction on the reference baseband signal based on the current sideband suppression parameter, to obtain a corrected reference baseband signal; input the corrected reference baseband signal to the modulator for modulation, to obtain a reference modulation signal; and adjust the current sideband suppression parameter according to a power of the reference modulation signal on a corresponding second suppression sideband, to obtain the sideband suppression parameter corresponding to the reference signal correlated parameter.

In some embodiments, the target sideband suppression parameter obtaining module is configured to: adjust the current sideband suppression parameter in a direction of decreasing the power of the reference modulation signal on the corresponding second suppression sideband, to obtain an updated current sideband suppression parameter; and go to the operation of obtaining a current sideband suppression parameter, and performing signal correction on the reference baseband signal based on the current sideband suppression parameter, to obtain a corrected reference baseband signal, and until an update stop condition is met, use the updated current sideband suppression parameter as the sideband suppression parameter corresponding to the reference signal correlated parameter, where the update stop condition includes at least one of a change between the current sideband suppression parameter before updating and the updated current sideband suppression parameter being less than a preset change threshold, the power on the second suppression sideband being less than a preset power threshold, or a quantity of updates of the current sideband suppression parameter being greater than a preset quantity.

In some embodiments, the target signal correlated parameter includes a baseband frequency corresponding to the target baseband signal, a baseband amplitude corresponding to the target baseband signal, and a carrier frequency of the carrier signal corresponding to the target baseband signal, and the target sideband suppression parameter obtaining module 1006 is configured to: obtain a carrier frequency; obtain a set of parameter correspondences corresponding to the carrier frequency, the parameter correspondences including a correspondence between a baseband frequency corresponding to a baseband signal and a sideband suppression parameter, and a correspondence between a baseband amplitude corresponding to the baseband signal and the sideband suppression parameter; and obtain the corresponding target sideband suppression parameter from the set of parameter correspondences according to the baseband frequency corresponding to the target baseband signal and the baseband amplitude corresponding to the target baseband signal.

In some embodiments, the modulation module 1010 is configured to input a real part corresponding to the target corrected baseband signal to an in-phase end of the modulator, input an imaginary part corresponding to the target corrected baseband signal to an orthogonal end of the modulator, and perform signal modulation by using the carrier signal of the carrier frequency to obtain the target modulation signal corresponding to the target baseband signal, to regulate a superconducting qubit according to the target modulation signal. In this application, the term "unit" or "module" refers to a computer program or part of the computer program that has a predefined function and works together with other related parts to achieve a predefined goal and may be all or partially implemented by using software, hardware (e.g., processing circuitry and/or memory configured to perform the predefined functions), or a combination thereof. Each unit or module can be implemented using one or more processors (or processors and memory). Likewise, a processor (or processors and memory) can be used to implement one or more modules or units. Moreover, each module or unit can be part of an overall module that includes the functionalities of the module or unit.

Figure 11:
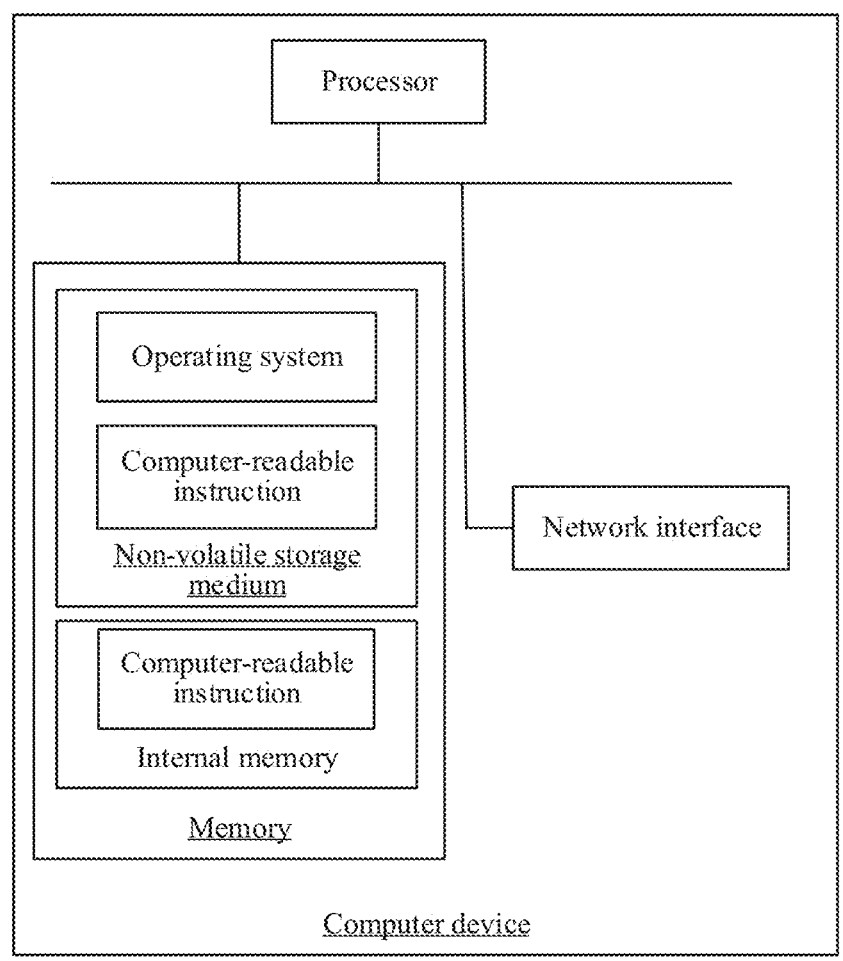
FIG. 11 is a block diagram of an internal structure of a computer device according to some embodiments.

FIG. 1 is a diagram of an internal structure of a computer device according to some embodiments. The computer device may be specifically the FPGA in FIG. 1. As shown in FIG. 11, the computer device includes a processor, a memory, and a network interface that are connected through a system bus. The memory includes a non-volatile storage medium and an internal memory. The non-volatile storage medium of the computer device stores an operating system, and may further store computer-readable instructions. The computer-readable instructions, when executed by the processor, may cause the processor to implement a sideband suppression method. The internal memory may also store a computer-readable instruction, and when the computer-readable instruction is executed by the processor, the processor may be caused to perform the sideband suppression method.

A person skilled in the art may understand that, the structure shown in FIG. 11 is only a block diagram of a part of a structure correlated to a solution of this application and does not limit the computer device to which the solution of this application is applied. Specifically, the computer device may include more or fewer members than those in the drawings, or include a combination of some members, or include different member layouts.

In some embodiments, the sideband suppression apparatus provided in this application may be implemented in a form of computer-readable instructions, and the computer-readable instructions may run on the computer device shown in FIG. 11. The memory of the computer device may store various program modules that form the sideband suppression apparatus, for example, the target baseband signal obtaining module 1002, the target signal correlated parameter obtaining module 1004, the target sideband suppression parameter obtaining module 1006, the correction processing module 1008, and the modulation module 1010 shown in FIG. 10. A computer-readable instruction formed by the program modules causes a processor to perform the steps in the sideband suppression method in the embodiments of this application described in this specification.

For example, the computer device shown in FIG. 11 may obtain a target baseband signal by using the target baseband signal obtaining module 1002 in the sideband suppression apparatus shown in FIG. 10. The target signal correlated parameter obtaining module 1004 is configured to obtain a target signal correlated parameter corresponding to the target baseband signal, the target signal correlated parameter including at least one of a signal feature parameter corresponding to the target baseband signal or a signal feature parameter of a carrier signal corresponding to the target baseband signal. The target sideband suppression parameter obtaining module 1006 is configured to obtain a corresponding target sideband suppression parameter according to the target signal correlated parameter. The correction processing module 1008 is configured to perform signal correction on the target baseband signal based on the target sideband suppression parameter, to obtain a target corrected baseband signal, the target sideband suppression parameter being used for suppressing a power of a first suppression sideband corresponding to the target baseband signal. The modulation module 1010 is configured to input the target corrected baseband signal to a modulator for signal modulation, to obtain a target modulation signal corresponding to the target baseband signal.

In some embodiments, a computer device is provided, including a memory and a processor, the memory storing computer-readable instructions, the computer-readable instructions, when executed by the processor, causing the processor to perform the steps of the foregoing sideband suppression method. Herein, the steps of the sideband suppression method may be the steps of the sideband suppression method in the foregoing embodiments.

In some embodiments, a computer-readable storage medium is provided, storing computer-readable instructions, the computer-readable instructions, when executed by the processor, causing the processor to perform the steps in the foregoing sideband suppression method. Herein, the steps of the sideband suppression method may be the steps of the sideband suppression method in the foregoing embodiments.

In some embodiments, a computer program product or a computer program is provided. The computer program product or the computer program includes computer instructions, and the computer instructions are stored in a computer-readable storage medium. The processor of the computer device reads the computer instructions from the computer-readable storage medium, and the processor executes the computer instructions, to cause the computer device to perform the steps in the method embodiments.

It is to be understood that although the steps in the flowcharts of the embodiments of this application are displayed in sequence according to arrows, the steps are not necessarily performed in the sequence indicated by the arrows. Unless otherwise explicitly specified in this application, execution of the steps is not strictly limited, and the steps may be performed in other sequences. In addition, at least some of the steps in the foregoing embodiments may include a plurality of substeps or a plurality of stages. These substeps or stages are not necessarily completed at the same moment, but may be performed at different moments. Besides, these substeps or stages may not be necessarily performed sequentially, but may be performed in turn or alternately with other steps or at least some of substeps or stages of other steps.

A person of ordinary skill in the art may understand that all or some of the procedures of the methods of the foregoing embodiments may be implemented by computer-readable instructions instructing relevant hardware. The computer-readable instructions may be stored in a non-volatile computer-readable storage medium. When the computer-readable instructions are executed, the procedures of the embodiments of the foregoing methods may be included. References to the memory, the storage, the database, or other media used in the embodiments provided in this application may all include a non-volatile or a volatile memory. The non-volatile memory may include a read-only memory (ROM), a programmable ROM (PROM), an electrically programmable ROM (EPROM), an electrically erasable programmable ROM (EEPROM), or a flash memory. The volatile memory may include a random access memory (RAM) or an external high-speed cache. By way of description rather than limitation, the RAM may be obtained in a plurality of forms, such as a static RAM (SRAM), a dynamic RAM (DRAM), a synchronous DRAM (SDRAM), a double data rate SDRAM (DDR SDRAM), an enhanced SDRAM (ESDRAM), a Synchlink DRAM (SLDRAM), a Rambus direct RAM (RDRAM), a direct Rambus dynamic RAM (DRDRAM), and a Rambus dynamic RAM (RDRAM).

The technical features in the foregoing embodiments may be combined in different manners. For concise description, not all possible combinations of the technical features in the embodiments are described. However, as long as combinations of the technical features do not conflict with each other, the combinations of the technical features are considered as falling within the scope described in this specification.

The foregoing embodiments show only several implementations of this application and are described in detail, which, however, are not to be construed as a limitation to the patent scope of this application. For a person of ordinary skill in the art, several transformations and improvements can be made without departing from the idea of this application. These transformations and improvements belong to the protection scope of this application. Therefore, the protection scope of this application is subject to the protection scope of the appended claims.

What is claimed is:

1. A sideband suppression method performed at a computer device, the method comprising:
    obtaining a target baseband signal and a target signal correlated parameter corresponding to the target baseband signal, the target signal correlated parameter comprising at least one of a signal feature parameter corresponding to the target baseband signal or a signal feature parameter of a carrier signal corresponding to the target baseband signal;
    obtaining a corresponding target sideband suppression parameter according to the target signal correlated parameter, the target sideband suppression parameter being used for suppressing a power of a first suppression sideband corresponding to the target baseband signal;
    obtaining an initial compensation signal corresponding to the target baseband signal;
    obtaining a target compensation signal according to the target sideband suppression parameter and the initial compensation signal;
    correcting the target baseband signal based on the target compensation signal to obtain a target corrected baseband signal to obtain a target corrected baseband signal; and
    inputting the target corrected baseband signal to a modulator for signal modulation, to obtain a target modulation signal corresponding to the target baseband signal.

2. The method according to claim 1, wherein the obtaining a target compensation signal according to the target sideband suppression parameter and the initial compensation signal comprises:
    multiplying the target sideband suppression parameter by the initial compensation signal to obtain a target compensation signal, the initial compensation signal being a complex conjugated signal corresponding to the target baseband signal, and a frequency of the initial compensation signal being opposite to a frequency of the target baseband signal; and
    the correcting the target baseband signal based on the target compensation signal to obtain a target corrected baseband signal comprises:
    adding the target compensation signal and the target baseband signal to obtain the target corrected baseband signal.

3. The method according to claim 1, wherein the correcting the target baseband signal based on the target compensation signal to obtain a target corrected baseband signal comprises:
    performing frequency domain transformation on the target baseband signal in a time domain, to obtain a target baseband signal in a frequency domain;
    correcting the target baseband signal in the frequency domain based on the initial compensation signal, to obtain a corrected baseband signal in the frequency domain; and
    performing time domain transformation on the corrected baseband signal in the frequency domain, to obtain the target corrected baseband signal in the time domain.

4. The method according to claim 1, wherein the obtaining a corresponding target sideband suppression parameter according to the target signal correlated parameter comprises:
    obtaining a set of parameter correspondences, the set of parameter correspondences comprising one or more parameter correspondences, and the one or more parameter correspondences comprising a correspondence between a signal correlated parameter and a sideband suppression parameter;
    obtaining a signal correlated parameter corresponding to the target signal correlated parameter in the set of parameter correspondences as a reference signal correlated parameter; and
    obtaining the target sideband suppression parameter corresponding to the target signal correlated parameter according to a sideband suppression parameter corresponding to the reference signal correlated parameter in the set of parameter correspondences.

5. The method according to claim 4, wherein the obtaining the target sideband suppression parameter corresponding to the target signal correlated parameter according to a sideband suppression parameter corresponding to the reference signal correlated parameter in the set of parameter correspondences comprises:
    performing interpolation calculation according to the sideband suppression parameter corresponding to the reference signal correlated parameter in the set of parameter correspondences, to obtain the target sideband suppression parameter corresponding to the target signal correlated parameter.

6. The method according to claim 4, wherein operations of obtaining the sideband suppression parameter corresponding to the reference signal correlated parameter in the set of parameter correspondences comprises:
- obtaining a reference baseband signal corresponding to the reference signal correlated parameter;
- obtaining a current sideband suppression parameter, and performing signal correction on the reference baseband signal based on the current sideband suppression parameter, to obtain a corrected reference baseband signal;
- inputting the corrected reference baseband signal to the modulator for modulation, to obtain a reference modulation signal; and
- adjusting the current sideband suppression parameter according to a power of the reference modulation signal on a corresponding second suppression sideband, to obtain the sideband suppression parameter corresponding to the reference signal correlated parameter.

7. The method according to claim 6, wherein the adjusting the current sideband suppression parameter according to a power of the reference modulation signal on a corresponding second suppression sideband, to obtain the sideband suppression parameter corresponding to the reference signal correlated parameter comprises:
- adjusting the current sideband suppression parameter in a direction of decreasing the power of the reference modulation signal on the corresponding second suppression sideband, to obtain an updated current sideband suppression parameter; and
- going to the operation of obtaining a current sideband suppression parameter, and performing signal correction on the reference baseband signal based on the current sideband suppression parameter, to obtain a corrected reference baseband signal, and until an update stop condition is met, using the updated current sideband suppression parameter as the sideband suppression parameter corresponding to the reference signal correlated parameter, wherein
- the update stop condition comprises at least one of a change between the current sideband suppression parameter before updating and the updated current sideband suppression parameter being less than a preset change threshold, the power on the second suppression sideband being less than a preset power threshold, or a quantity of updates of the current sideband suppression parameter being greater than a preset quantity.

8. The method according to claim 1, wherein the target signal correlated parameter comprises a baseband frequency corresponding to the target baseband signal, a baseband amplitude corresponding to the target baseband signal, and a carrier frequency of the carrier signal corresponding to the target baseband signal, and the obtaining a corresponding target sideband suppression parameter according to the target signal correlated parameter comprises:
- obtaining a carrier frequency;
- obtaining a set of parameter correspondences corresponding to the carrier frequency, the parameter correspondences comprising a correspondence between a baseband frequency corresponding to a baseband signal and a sideband suppression parameter, and a correspondence between a baseband amplitude corresponding to the baseband signal and the sideband suppression parameter; and
- obtaining the corresponding target sideband suppression parameter from the set of parameter correspondences according to the baseband frequency corresponding to the target baseband signal and the baseband amplitude corresponding to the target baseband signal.

9. The method according to claim 8, wherein the inputting the target corrected baseband signal to a modulator for signal modulation, to obtain a target modulation signal corresponding to the target baseband signal comprises:
- inputting a real part corresponding to the target corrected baseband signal to an in-phase end of the modulator, inputting an imaginary part corresponding to the target corrected baseband signal to an orthogonal end of the modulator, and performing signal modulation by using the carrier signal of the carrier frequency to obtain the target modulation signal corresponding to the target baseband signal, to regulate a superconducting qubit according to the target modulation signal.

10. A computer device, comprising a memory and a processor, the memory storing computer-readable instructions, the computer-readable instructions, when executed by the processor, causing the computer device to perform a plurality of operations including:
- obtaining a target baseband signal and a target signal correlated parameter corresponding to the target baseband signal, the target signal correlated parameter comprising at least one of a signal feature parameter corresponding to the target baseband signal or a signal feature parameter of a carrier signal corresponding to the target baseband signal;
- obtaining a corresponding target sideband suppression parameter according to the target signal correlated parameter, the target sideband suppression parameter being used for suppressing a power of a first suppression sideband corresponding to the target baseband signal;
- obtaining an initial compensation signal corresponding to the target baseband signal;
- obtaining a target compensation signal according to the target sideband suppression parameter and the initial compensation signal;
- correcting the target baseband signal based on the target compensation signal to obtain a target corrected baseband signal to obtain a target corrected baseband signal; and
- inputting the target corrected baseband signal to a modulator for signal modulation, to obtain a target modulation signal corresponding to the target baseband signal.

11. The computer device according to claim 10, wherein the obtaining a target compensation signal according to the target sideband suppression parameter and the initial compensation signal comprises:
- multiplying the target sideband suppression parameter by the initial compensation signal to obtain a target compensation signal, the initial compensation signal being a complex conjugated signal corresponding to the target baseband signal, and a frequency of the initial compensation signal being opposite to a frequency of the target baseband signal; and
- the correcting the target baseband signal based on the target compensation signal to obtain a target corrected baseband signal comprises:
- adding the target compensation signal and the target baseband signal to obtain the target corrected baseband signal.

12. The computer device according to claim 10, wherein the correcting the target baseband signal based on the target compensation signal to obtain a target corrected baseband signal comprises:
 performing frequency domain transformation on the target baseband signal in a time domain, to obtain a target baseband signal in a frequency domain;
 correcting the target baseband signal in the frequency domain based on the initial compensation signal, to obtain a corrected baseband signal in the frequency domain; and
 performing time domain transformation on the corrected baseband signal in the frequency domain, to obtain the target corrected baseband signal in the time domain.

13. The computer device according to claim 10, wherein the obtaining a corresponding target sideband suppression parameter according to the target signal correlated parameter comprises:
 obtaining a set of parameter correspondences, the set of parameter correspondences comprising one or more parameter correspondences, and the one or more parameter correspondences comprising a correspondence between a signal correlated parameter and a sideband suppression parameter;
 obtaining a signal correlated parameter corresponding to the target signal correlated parameter in the set of parameter correspondences as a reference signal correlated parameter; and
 obtaining the target sideband suppression parameter corresponding to the target signal correlated parameter according to a sideband suppression parameter corresponding to the reference signal correlated parameter in the set of parameter correspondences.

14. The computer device according to claim 10, wherein the target signal correlated parameter comprises a baseband frequency corresponding to the target baseband signal, a baseband amplitude corresponding to the target baseband signal, and a carrier frequency of the carrier signal corresponding to the target baseband signal, and the obtaining a corresponding target sideband suppression parameter according to the target signal correlated parameter comprises:
 obtaining a carrier frequency;
 obtaining a set of parameter correspondences corresponding to the carrier frequency, the parameter correspondences comprising a correspondence between a baseband frequency corresponding to a baseband signal and a sideband suppression parameter, and a correspondence between a baseband amplitude corresponding to the baseband signal and the sideband suppression parameter; and
 obtaining the corresponding target sideband suppression parameter from the set of parameter correspondences according to the baseband frequency corresponding to the target baseband signal and the baseband amplitude corresponding to the target baseband signal.

15. A non-transitory computer-readable storage medium storing computer-readable instructions, the computer-readable instructions, when executed by one or more processors of a computer device, causing the computer device to perform a plurality of operations including:
 obtaining a target baseband signal and a target signal correlated parameter corresponding to the target baseband signal, the target signal correlated parameter comprising at least one of a signal feature parameter corresponding to the target baseband signal or a signal feature parameter of a carrier signal corresponding to the target baseband signal;
 obtaining a corresponding target sideband suppression parameter according to the target signal correlated parameter, the target sideband suppression parameter being used for suppressing a power of a first suppression sideband corresponding to the target baseband signal;
 obtaining an initial compensation signal corresponding to the target baseband signal;
 obtaining a target compensation signal according to the target sideband suppression parameter and the initial compensation signal;
 correcting the target baseband signal based on the target compensation signal to obtain a target corrected baseband signal to obtain a target corrected baseband signal; and
 inputting the target corrected baseband signal to a modulator for signal modulation, to obtain a target modulation signal corresponding to the target baseband signal.

16. The non-transitory computer-readable storage medium according to claim 15, wherein the obtaining a corresponding target sideband suppression parameter according to the target signal correlated parameter comprises:
 obtaining a set of parameter correspondences, the set of parameter correspondences comprising one or more parameter correspondences, and the one or more parameter correspondences comprising a correspondence between a signal correlated parameter and a sideband suppression parameter;
 obtaining a signal correlated parameter corresponding to the target signal correlated parameter in the set of parameter correspondences as a reference signal correlated parameter; and
 obtaining the target sideband suppression parameter corresponding to the target signal correlated parameter according to a sideband suppression parameter corresponding to the reference signal correlated parameter in the set of parameter correspondences.

17. The non-transitory computer-readable storage medium according to claim 15, wherein the target signal correlated parameter comprises a baseband frequency corresponding to the target baseband signal, a baseband amplitude corresponding to the target baseband signal, and a carrier frequency of the carrier signal corresponding to the target baseband signal, and the obtaining a corresponding target sideband suppression parameter according to the target signal correlated parameter comprises:
 obtaining a carrier frequency;
 obtaining a set of parameter correspondences corresponding to the carrier frequency, the parameter correspondences comprising a correspondence between a baseband frequency corresponding to a baseband signal and a sideband suppression parameter, and a correspondence between a baseband amplitude corresponding to the baseband signal and the sideband suppression parameter; and
 obtaining the corresponding target sideband suppression parameter from the set of parameter correspondences according to the baseband frequency corresponding to the target baseband signal and the baseband amplitude corresponding to the target baseband signal.

18. The non-transitory computer-readable storage medium according to claim 15, wherein the obtaining a target compensation signal according to the target sideband suppression parameter and the initial compensation signal comprises:
- multiplying the target sideband suppression parameter by the initial compensation signal to obtain a target compensation signal, the initial compensation signal being a complex conjugated signal corresponding to the target baseband signal, and a frequency of the initial compensation signal being opposite to a frequency of the target baseband signal; and
- the correcting the target baseband signal based on the target compensation signal to obtain a target corrected baseband signal comprises:
- adding the target compensation signal and the target baseband signal to obtain the target corrected baseband signal.

19. The non-transitory computer-readable storage medium according to claim 15, wherein the correcting the target baseband signal based on the target compensation signal to obtain a target corrected baseband signal comprises:
- performing frequency domain transformation on the target baseband signal in a time domain, to obtain a target baseband signal in a frequency domain;
- correcting the target baseband signal in the frequency domain based on the initial compensation signal, to obtain a corrected baseband signal in the frequency domain; and
- performing time domain transformation on the corrected baseband signal in the frequency domain, to obtain the target corrected baseband signal in the time domain.

* * * * *